US012426406B2

(12) United States Patent
Roqan et al.

(10) Patent No.: US 12,426,406 B2
(45) Date of Patent: Sep. 23, 2025

(54) DISLOCATION FREE SEMICONDUCTOR NANOSTRUCTURES GROWN BY PULSE LASER DEPOSITION WITH NO SEEDING OR CATALYST

(71) Applicant: KING ABDULLAH UNIVERSITY OF SCIENCE AND TECHNOLOGY, Thuwal (SA)

(72) Inventors: Iman Salem Roqan, Thuwal (SA); Dhaifallah Rahim Almalawi, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 701 days.

(21) Appl. No.: 17/423,606

(22) PCT Filed: Feb. 10, 2020

(86) PCT No.: PCT/IB2020/051028
§ 371 (c)(1),
(2) Date: Jul. 16, 2021

(87) PCT Pub. No.: WO2020/161685
PCT Pub. Date: Aug. 13, 2020

(65) Prior Publication Data
US 2022/0108887 A1    Apr. 7, 2022

Related U.S. Application Data

(60) Provisional application No. 62/948,998, filed on Dec. 17, 2019, provisional application No. 62/803,515, filed on Feb. 10, 2019.

(51) Int. Cl.
*H10H 20/01* (2025.01)
*H01G 9/00* (2006.01)
(Continued)

(52) U.S. Cl.
CPC ...... *H10H 20/0137* (2025.01); *H01G 9/0036* (2013.01); *H01G 9/2009* (2013.01);
(Continued)

(58) Field of Classification Search
CPC ......... H01L 21/02631; H01L 21/02376; H01L 21/02381; H01L 21/02389;
(Continued)

(56) References Cited

U.S. PATENT DOCUMENTS 7,355,216 B2 * 4/2008 Yang ................... H01L 21/0242
257/E21.108
7,407,872 B2 * 8/2008 Han .................. H01L 21/02639
257/E21.112
(Continued)

FOREIGN PATENT DOCUMENTS

| WO | WO-2009009612 A2 * | 1/2009 | ........... C30B 25/005 |
| WO | WO-2016030746 A1 * | 3/2016 | ............... C01G 1/02 |
| WO | WO-2017068450 A1 * | 4/2017 | ........... C30B 23/025 |

OTHER PUBLICATIONS

International Search Report in corresponding/related International Application No. PCT/IB2020/051028, date of mailing Apr. 29, 2020.
(Continued)

*Primary Examiner* — Eva Y Montalvo
*Assistant Examiner* — Pratiksha Jayant Lohakare
(74) *Attorney, Agent, or Firm* — PATENT PORTFOLIO BUILDERS PLLC

(57) ABSTRACT

There is a method for forming a semiconductor nanostructure on a substrate. The method includes placing a substrate and a semiconductor material in a pulsed laser deposition chamber; selecting parameters including a fluence of a laser beam, a pressure P inside the chamber, a temperature T of the substrate, a distance d between the semiconductor mate-
(Continued)

rial and the substrate, and a gas molecule diameter $a_0$ of a gas to be placed inside the chamber so that conditions for a Stranski-Krastanov nucleation are created; and applying the laser beam with the selected fluence to the semiconductor material to form a plume of the semiconductor material. The selected parameters determine the formation, from the plume, of (1) a nanolayer that covers the substrate, (2) a polycrystalline wetting layer over the nanolayer, and (3) a single-crystal nanofeature over the polycrystalline wetting layer, and the single-crystal nanofeature is grown free of any catalyst or seeding layer.

21 Claims, 22 Drawing Sheets

(51) Int. Cl.
| | | |
|---|---|---|
| *H01G 9/20* | (2006.01) | |
| *H01L 21/02* | (2006.01) | |
| *H01S 5/343* | (2006.01) | |
| *H10H 20/813* | (2025.01) | |
| *H10H 20/821* | (2025.01) | |
| *H10H 20/825* | (2025.01) | |
| *H10H 20/833* | (2025.01) | |
| *H10K 85/50* | (2023.01) | |
| *H10K 30/10* | (2023.01) | |
| *H10K 30/35* | (2023.01) | |
| *H10K 30/50* | (2023.01) | |

(52) U.S. Cl.
CPC .. *H01L 21/02376* (2013.01); *H01L 21/02381* (2013.01); *H01L 21/02389* (2013.01); *H01L 21/02417* (2013.01); *H01L 21/0242* (2013.01); *H01L 21/02458* (2013.01); *H01L 21/02513* (2013.01); *H01L 21/0254* (2013.01); *H01L 21/02603* (2013.01); *H01L 21/02631* (2013.01); *H01S 5/343* (2013.01); *H10H 20/01335* (2025.01); *H10H 20/813* (2025.01); *H10H 20/821* (2025.01); *H10H 20/825* (2025.01); *H10H 20/833* (2025.01); *H10K 85/50* (2023.02); *H10H 20/032* (2025.01); *H10K 30/10* (2023.02); *H10K 30/352* (2023.02); *H10K 30/50* (2023.02)

(58) Field of Classification Search
CPC ........... H01L 21/02417; H01L 21/0242; H01L 33/08; H01L 33/24; H01L 31/035227; H01L 31/1856; H01L 33/18; H01G 9/0036; H01G 9/2009; H01S 5/343; H01S 5/34333; H10K 30/352; H10K 30/10; H10K 85/50; Y02E 10/544; C30B 23/025
USPC .......................................................... 438/46
See application file for complete search history.

(56) References Cited

U.S. PATENT DOCUMENTS

| | | | | |
|---|---|---|---|---|
| 7,445,742 | B2* | 11/2008 | Chen | B29C 33/42 |
| | | | | 264/293 |
| 8,790,999 | B2* | 7/2014 | Sugiyama | H01L 21/02491 |
| | | | | 438/479 |
| 8,964,020 | B2* | 2/2015 | Hersee | G02B 21/06 |
| | | | | 348/80 |
| 9,024,338 | B2* | 5/2015 | Seifert | H01L 21/02603 |
| | | | | 977/932 |
| 9,275,857 | B1* | 3/2016 | Hersee | H10D 30/014 |
| 10,861,696 | B2* | 12/2020 | Weman | B82Y 30/00 |
| 11,276,799 | B2* | 3/2022 | Mi | H10H 20/812 |
| 2007/0257264 | A1* | 11/2007 | Hersee | H10H 20/813 |
| | | | | 257/E33.068 |
| 2008/0073743 | A1* | 3/2008 | Alizadeh | H10F 77/146 |
| | | | | 438/93 |
| 2010/0276664 | A1* | 11/2010 | Hersee | H01L 21/02636 |
| | | | | 257/15 |
| 2011/0140072 | A1* | 6/2011 | Varangis | H01L 21/02389 |
| | | | | 977/762 |
| 2018/0222766 | A1 | 8/2018 | Roqan et al. | |
| 2018/0261455 | A1 | 9/2018 | Ooi et al. | |
| 2019/0360113 | A1* | 11/2019 | Ooi | H10F 71/1274 |
| 2020/0006051 | A1* | 1/2020 | Kim | H01L 21/02376 |
| 2020/0161504 | A1* | 5/2020 | Fimland | H01L 33/16 |

OTHER PUBLICATIONS

Son, D.-Y., et al., "11% Efficient Perovskite Solar Cell Based on ZnO Nanorods: An Effective Charge Collection System," The Journal of Physical Chemistry, Mar. 7, 2014, vol. 118, No. 30, pp. 16567-16573, American Chemical Society.
Written Opinion of the International Searching Authority in corresponding/related International Application No. PCT/IB2020/051028, date of mailing Apr. 29, 2020.
First Office Action in corresponding/related Japanese Patent Application issued Feb. 5, 2024.

* cited by examiner

DISLOCATION FREE SEMICONDUCTOR NANOSTRUCTURES GROWN BY PULSE LASER DEPOSITION WITH NO SEEDING OR CATALYST

CROSS-REFERENCE TO RELATED APPLICATIONS

This application is a U.S. National Stage Application of International Application No. PCT/IB2020/051028, filed on Feb. 10, 2020, which claims priority to U.S. Provisional Patent Application No. 62/803,515, filed on Feb. 10, 2019, entitled "MANUFACTURE OF GAN AND OTHER SEMICONDUCTOR MATERIAL NANOWIRES/NANOTUBES/NANORODS FOR FABRICATING DEVICES, INVOLVING ABLATING TARGET COMPRISING SEMICONDUCTORS WITH LASER," and U.S. Provisional Patent Application No. 62/948,998, filed on Dec. 17, 2019, entitled "DISLOCATION-FREE SELF-ASSEMBLY GAN NANOWIRES GROWN ON BULK AND 2D SUBSTRATES FOR HIGH-EFFICIENCY UV EMITTING DEVICES," the disclosures of which are incorporated herein by reference in their entirety.

BACKGROUND

Technical Field

Embodiments of the disclosed subject matter generally relate to semiconductor devices having nanofeatures as nanowires or nanorods or nanotubes, which are grown on a substrate with a pulse laser deposition method without use of a seed or a catalysts, which eliminates the lattice mismatch effect between the substrate and the nanofeatures. No dislocation is observed in the interface between the nanofeature and the substrate. Further, some of the embodiments relate to a semiconductor based device that has a high-efficiency ultraviolet emission.

Discussion Of The Background

Group-III elements, including aluminum, boron, gallium, and indium, are considered to be particularly useful for a variety of semiconductor devices, including optoelectronic devices (e.g., light emitting diodes (LEDs), laser diodes, etc.) and high-power and/or high-frequency electrical power devices used for sensing, medical curing, and industrial applications in harsh environments. These group-III elements are typically incorporated into semiconductor devices in the form of III-compounds (III-oxides or III-nitrides). Techniques for forming high-quality group-III oxide structures, such as nanostructures, films, etc., on substrates have been known for some time. However, current techniques for forming III-nitride structures, and in particular nanostructures, on substrates typically do not produce high-quality III-nitride structures or are cost prohibitive.

The lattice-mismatch between the substrate and the III-nitride structures, which results in threading dislocations (TDs) in the III-nitride structures is the main cause for the formation of low-quality III-nitride structures on a substrate. In fact, any semiconductor formed on a different substrate exhibits lattice-mismatch between the substrate and the grown materials. These dislocations are mainly due to the lattice mismatch between the material making the substrate and the material making the nanostructures. Although the strain can be addressed by employing a substrate that is similar in terms of the lattice size to the III-nitride, these substrates are typically expensive, which limits these types of devices to the research domain, and does not allow such devices to be economically commercialized. For example, forming gallium nitride structures on a gallium nitride substrate substantially eliminates dislocations between these layers as both the substrate and the nanostructure has the same lattice, and thus does not exhibit significant threading dislocations, yet gallium nitride substrates are extremely expensive.

Due to the high cost of III-nitride substrates, other techniques have been pursued to form III-nitride structures on more cost-effective substrates, such as silicon substrates for mass production and large scale applications. In this regard, it is known that III-nitrides and some other semiconductor growth rely on substrates that have a large lattice mismatch with them, which causes dislocations. The native substrate cannot be used for large scale applications. The price of native GaN or AlN substrates is extremely expensive (one-inch substrate wafer costs between 5,000-8,000 USD) as their growth techniques are also expensive and it needs very expensive maintenance. Thus, it is not possible to implement mass production or large scale applications with the native substrates. This is why, many companies struggle to grow the semiconductors on Si or Sapphire substrates. Two of the most common techniques focus on aluminum gallium nitride/gallium nitride (AlGaN/GaN), indium gallium nitride/gallium nitride (InGaN/GaN), AlGaN/AlGaN or any III-nitride-based multiple quantum well (MQW) and gallium nitride (GaN) nanowire (NW) structures formed using metalorganic chemical vapor deposition (MOCVD) and molecular beam epitaxy (MBE) that are costly not only because the techniques themselves are expensive, but also because the raw III-materials used for growth are expensive. Even with these expensive techniques, it is difficult to obtain high-quality III-nitride structures on commonly used substrates, such as silicon substrates. Further, the MOCVD and MBE methods are expensive and the native substrates are not suitable for large scale and large mass production.

The MOCVD and MBE methods also typically require the use of a seeding/pre-textured layer or metal catalyst to be first deposited on the substrate followed by forming the nanostructure directly on the seeding layer. The purpose of the seeding layer or the metal catalyst is to facilitate nanofeatures (e.g., nanowire or nanorods) growth and diminish the large mismatch that is present between the lattice of the substrate and the lattice of the nanostructure, (e.g., the seeding layer or the metal catalyst are selected to have a lattice constant between the lattice constant of the substrate and the lattice constant of the nanostructure, or they are selected to have a desired surface energy level to promote a certain growth mechanism). However, a general disadvantage of using the seeding layer or the metal catalyst is that the transmission of light from the nanostructure to the substrate or vice versa is negatively impacted as the metal seeding layer or catalyst are opaque to the light. The most commonly used metal catalysts for forming gallium nitride nanowires are gold (Au) and nickel (Ni). These metal catalysts, however, act as contaminants in the resulting semiconductor device because these metals absorb emitted ultraviolet (UV) light, which further reduces device efficiency beyond the reduction due to the strain between the substrate and the III-nitride structures.

Other techniques for forming the nanostructures with a reduced strain on a substrate involve the use of two-dimensional (2D) substrates (e.g., graphene) acting as sacrificial layers for lifting-off devices. However, from a practical point of view, the lifting-off process is very inefficient due to the high rate of breakage of the produced devices.

In addition, all of these techniques/methods are extremely expensive, none of the techniques could improve the efficiency of a semiconductor device comprising III-nitride nanowires on a substrate in the ultraviolet range ($\lambda$<365 nm), and none of these techniques produce III-nitride nanowires that are free of threading dislocations.

Further, these techniques are only applicable to a small class of semiconductor materials, and once the semiconductor material is selected, the class of substrates on which the selected semiconductor material can be deposited is even smaller due to the particulars of these methods.

Thus, there is a need for systems and methods for forming any semiconductor nanostructure (e.g., nanowire, nanorod, nanotube, etc.) on most of the possible substrates and can be suitable for large scale production, to improve the efficiency of the formed device in the ultraviolet range over the existing devices, and to produce nanostructures free of threading dislocations.

SUMMARY

According to an embodiment, there is a method for forming a semiconductor nanostructure on a substrate. The method includes placing a substrate and a semiconductor material in a pulsed laser deposition chamber, selecting parameters including a fluence of a laser beam, a pressure P inside the chamber, a temperature T of the substrate, a distance d between the semiconductor material and the substrate, and a gas molecule diameter $a_0$ of a gas to be placed inside the chamber so that conditions for a Stranski-Krastanov nucleation are created, and applying the laser beam with the selected fluence to the semiconductor material to form a plume of the semiconductor material. The selected parameters determine the formation, from the plume, of (1) a nanolayer that covers the substrate, (2) a polycrystalline wetting layer over the nanolayer, and (3) a single-crystal nanofeature over the polycrystalline wetting layer. The single-crystal nanofeature is grown free of any catalyst or seeding layer.

According to another embodiment, there is a semiconductor device that includes a substrate, a nanolayer formed directly on the substrate, a semiconductor, polycrystalline, wetting layer arranged on the nanolayer, and semiconductor, single-crystal nanowires arranged directly on the semiconductor, polycrystalline, wetting layer. The semiconductor, single-crystal nanowires are free of threading dislocations.

BRIEF DESCRIPTION OF THE DRAWINGS

The accompanying drawings, which are incorporated in and constitute a part of the specification, illustrate one or more embodiments and, together with the description, explain these embodiments. In the drawings:

FIG. 5A illustrates X-ray powder diffraction patterns produced by GaN nanowires grown on various substrates while

FIG. 10A illustrates the absorbance of a photodetector that is based only on a perovskite layer while

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of III-nitride semiconductor devices having III-nitride nanowires. However, one skilled in the art would understand, after reading this disclosure, that the novel process discussed herein is applicable to any semiconductor device, for example, any binary compound III-V or II-VI as GaAs, SiC, InN, GaN, AlN, pure elements from the group 14 of the periodic table like Si or Ge, and certain ternary compounds as InGaN, AlGaN, oxides or alloys. Further, as will be discussed herein, this novel method can be applied to manufacture various optical and/or semiconductor devices that have nanowires, nanorods, nanotubes, nanopyramids, and/or nanodisks and/or quantum wells that may be formed on these nanostructures.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the specific features, structures or characteristics may be combined in any suitable manner in one or more embodiments.

Figure 1:
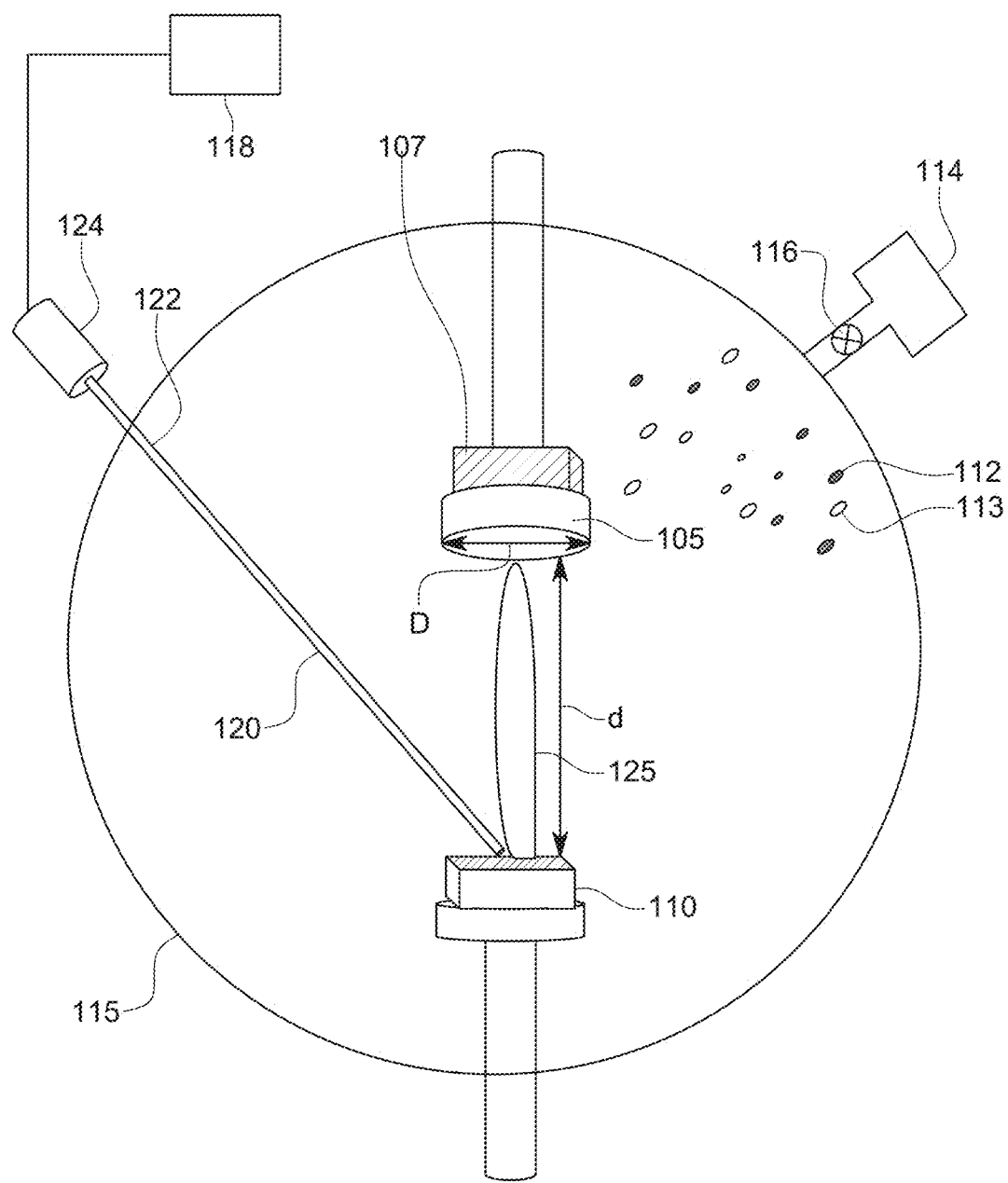
FIG. 1 is a schematic diagram of a pulsed laser deposition (PLD) chamber used to form nano-features on a substrate.

According to an embodiment illustrated in FIG. 1, a novel method that uses pulsed laser deposition (PLD) is discussed with regard to forming an III-nitride semiconductor device. However, as noted above, this method can be applied to any kind of semiconductor material to form an optical or electrooptical, photonic, spintronic, magnetic semiconductor, photovoltaic or electronic device or sensors on many possible substrates. A characteristic of this method is that no seeding layer or catalyst is used to grow the semiconductor material into a nanostructure on the substrate. In other words, the method discussed herein is capable to form the semiconductor material directly on the selected substrate without prior treatment of the substrate for depositing a seeing material. It is noted that the existing methods that deposit a semiconductor nanowire on a Si or GaN substrate, first coat the substrate with a layer of gold (Au) so that the mismatch between the nanowire lattice constant and the substrate lattice constant is reduced and to facilitate the NW growth.

However, such methods still face many threading dislocations between the substrate and the nanowires, which degrade the quality of the final product. These problems that plaque the existing PLD methods are solved by the method of FIG. 1 by not using any seeding layer or metallic catalyst in the deposition chamber. The method is now explained with regard to FIGS. 1 and 2. FIG. 1 shows a substrate 105 (for example, Si, GaN, sapphire, Ga2O3, ZnO, MXene, graphene, transition metal dichalcogenides' (TMDCs), such as $MoS_2$, $WSe_2$ to name a few) and a target 110 (for example, a III-nitride material) being arranged in a pulsed laser deposition (PLD) chamber 115 at a distance d from each other. This distance d can be adjusted as discussed later, nevertheless, it is of the order of centimeters to tens of centimeters in this embodiment. A heater 107 may be provided inside the chamber 115, for example, attached to the substrate 105 as shown in FIG. 1, for heating the substrate to a desired temperature T. The heater 107 is controlled by the computing device 118. The substrate 105 may be a 4" wafer that is typically used for commercial production and large-scale applications. In one application, it is possible to simultaneously grow the nanostructures on plural 4" wafers placed in the same chamber 115.

The chamber 115 is vacuumed so that most of the air is removed. A gas 112 (e.g., a gas including a component that is found into the semiconductor to be grown) is introduced into the chamber 115, from a gas source 114, for example, a gas tank, that is fluidly connected to the chamber. A valve 116 may be adjusted, for example, by the computing device 118, to control the amount of the gas 112 inside the chamber 115. If the nanostructure to be grown onto the substrate 105 is GaN, then the gas 112 is selected to be N. Note that other gasses may be used.

A laser beam 120 is applied through a laser transparent window 122 formed into the wall of the chamber 115, to the III-nitride target 110 to form a plume 125 of the III-nitride material. The laser beam 120 is generated with a laser 124, which is controlled by the computing device 118. The computing device 118 is configured to select the energy imparted by the laser beam on the unit area, i.e., the fluence, pulsing frequency $f_p$ of the laser, the length of the pulse, and the total time for which the laser is turned on during this process. These parameters are discussed in detail later.

Turning now to FIGS. 2 and 3A-3C, the method starts in step 200 by selecting the fluence and the pulsing frequency of the laser 124, the distance d between the target and the substrate inside the chamber 115, the temperature T inside the chamber, the pressure p of the gas 112, and the type of gas 112. Based on these conditions, the computing device 118 applies in step 202 the selected parameters to the PLD chamber 115 and the laser 124, and the growing process starts. Once selected, these conditions are maintained constant in step 204 through the entire process, therefore this method is a single step PLD method. Then, in step 206, the nanostructures are grown over the substrate until a desired height of the nanostructures is obtained.

Figure 3A:
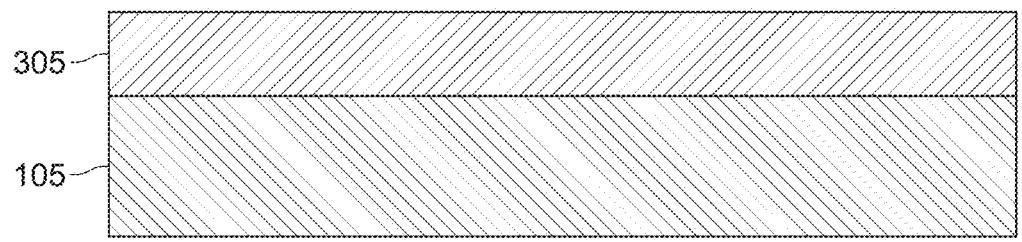
FIGS. 3A-3C illustrate various states of forming the semiconductor device with the PLD method.

As illustrated in FIG. 3A, atoms from the plume 125 (Ga and N atoms if the III-nitride semiconductor material is GaN) and atoms from the gas 112 (e.g., N atoms) start to adhere to the exposed surface of the target 105 and form an initial layer 305, mainly formed from the atoms of the plume. However, any impurity left in the chamber, for example oxygen (O) atoms 113, are also deposited on the substrate 105, contributing to the formation of the initial layer 305. Other impurities, for example, H or/and C may also be present and thus, they are being deposited in the initial layer 305. However, no metal impurities should be present in the chamber 115 to prevent the UV absorption when the nanostructures are formed. As the temperature T inside the chamber 115 is maintained constant by the heater 107, the impurities 113 that are now part of the initial layer 305, start to migrate toward the substrate 105 and separate themselves from the Ga and N atoms, forming an in-situ nanolayer 307, which is in direct contact to the substrate 105. Because the amount of impurity atoms 113 is very small, a thickness t of this layer is in the range of 1 to 2 nm (generally smaller than 10 nm), for which reason this layer is also called a nanolayer or a 2D layer. In one embodiment, the initial layer 305 is a 2D layer and includes an oxide.

At the same time, the initial layer 305 is changing as the impurities 113 are migrating toward the substrate 105 and this layer includes a GaN polycrystalline layer 309, called herein a wetting layer. These processes are controlled by the surface energy of each of these layers as follows. In one embodiment, the conditions within the PLD chamber 115 and the laser operation conditions are selected so that a surface energy of the substrate 105 is substantially equal to a sum of a surface energy of the target material 110 deposited on the substrate 105 and an interface energy between the substrate 105 and the material deposited on the substrate 105. As a consequence of this energy balance, the continuous layer 305 is formed as illustrated in FIG. 3A.

Figure 3B:
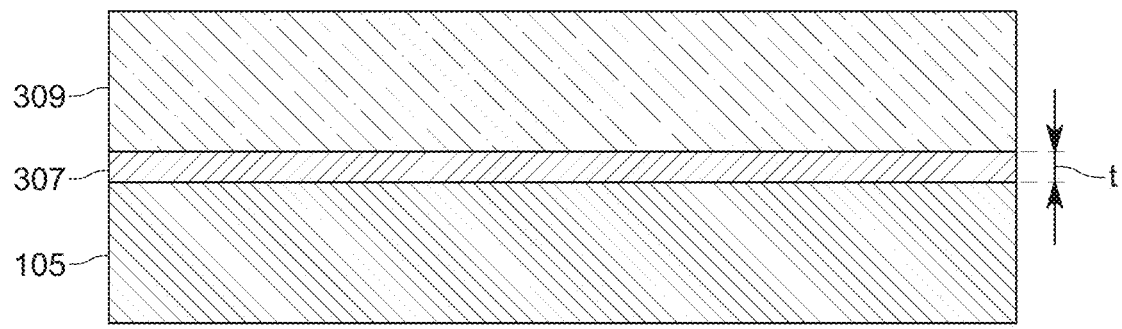
Figure 3C:
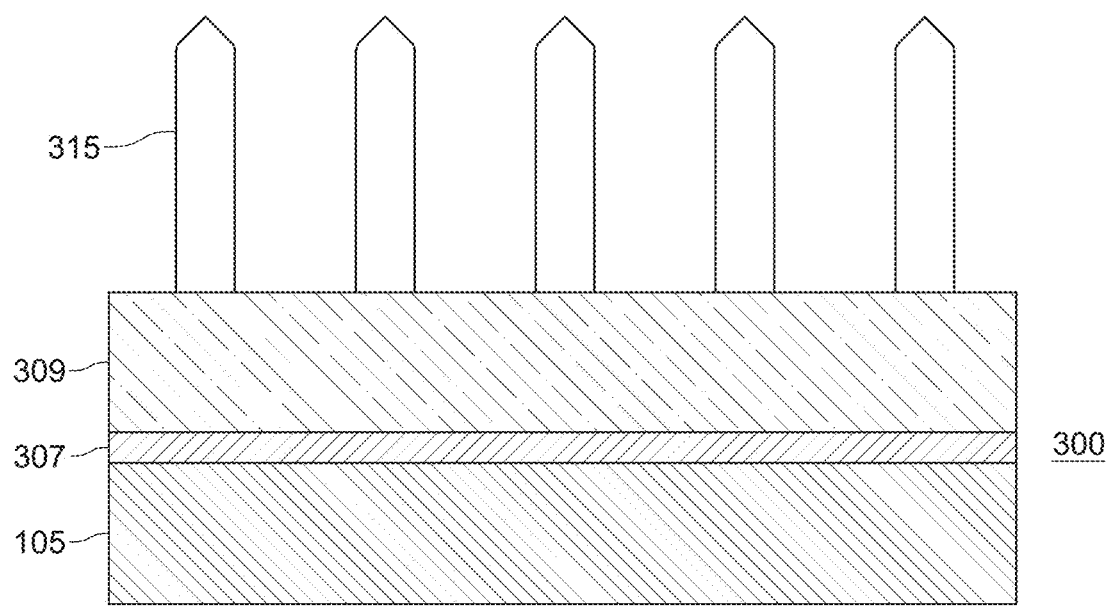

However, as the PLD process continues and the impurities atoms 13 migrate toward the substrate 105, and form the in situ interface nano layer 307, the surface energy of the polycrystalline layer 309 changes, and thus, a Stranski-Krastanov (SK) nucleation is initiated, i.e., when the surface energy of the substrate (γs), which is now the layer 309, is greater than the sum of the surface energy of the growing nucleation (γn) and the interface energy between the new substrate and the growing islands of nanowires (γi). This is in contrast to the Frank-van der Merwe growth that dominates the initial stages of the initial layer 305 deposition. Once the SK nucleation is initiated, under the initial conditions of the chamber and laser discussed above, the growth on the wetting layer 309 becomes favorable for nanowire formation, which results in the formation of nanostructures (in this case nanowires) 315. Note that the layers shown in FIGS. 3A to 3C are not drawn to scale.

An analysis of the nanowires (which is discussed later) indicate that although the wetting layer 309 is polycrystalline, the nanowires are single crystal structures. By achieving the Stranski-Krastanov nucleation, the growth factors are favorable for nanowire formation free of threading dislocations. The nanowires made with the method illustrated in FIG. 1 resulted in the formation of 1-3 μm tall wires having a diameter between 100 and 200 nm.

To assess the GaN nanowire (NW) growth uniformity across a large wafer substrate, as this procedure is believed to be suitable for industrial-scale production, high-quality, vertically-aligned, GaN NWs were obtained on a 4" Si substrate, confirming that the GaN NW distribution has remained uniform without compromising the quality. Confirmatory PL spectra with sharp emission without defect band were obtained, demonstrating high quality materials across a large number of possible substrates. Thus, this cost-effective method is suitable for a wide range of applications based on high-quality semiconductor NWs as several 4" substrates can be formed from one target. This high-quality of the obtained NW is believed to be due to the formation of the in-situ nano layer 307, and the polycrystalline layer 309, both of which having the effect of smoothly transitioning the size of the lattice constant of the substrate to the lattice constant of the semiconductor material. Because these two layers are formed while the target semiconductor is ablated by the laser beam, any semiconductor NW may be formed on any substrate as these two layers would ensure the smooth transition of the lattice constant from the selected substrate to the selected NW material.

The parameters selected in step 200 of the method are now discussed for the specific example of GaN formed on a Si substrate. Those skilled in the art would understand that if the semiconductor material or the substrate or both are changed, the method discussed herein is still applicable but with some parameter modifications, for example, the temperature is adjusted to be around the melting point temperature of the semiconductor device.

The selection of the parameters noted in step 200 of the method is based on achieving an initial Frank-van der Merwe growth of the polycrystalline wetting layer 309, followed by SK nucleation on the wetting layer 309, and growing the single crystal NWs 315. A polycrystalline layer is understood herein to include plural crystallites that are separated by various defects (or grain boundaries) while a single crystalline material is understood to not include any defects or grain boundaries, i.e., to have a single crystalline structure. To achieve these two growing mechanisms successively in the single step PLD deposition while maintaining constant the selected parameters, a species energy E that characterizes the species when arriving at the target 105, as a consequence of the ablation process, can be defined using the following equation:

$$E = E_o \exp\left(-\frac{d}{\lambda}\right), \quad (1)$$

where E represents the energy of a single species (for example Ga, or N, or O from the plume) with which that species reaches the target 105 following the ablation process, $E_o$ represents the initial energy of the charged species in the plume emerging from the target surface, d is the distance between the target 110 and the substrate 105, and λ is the mean free path of the ablated species (in the plasma plume) traveling towards the substrate 105 in the PLD chamber 115, which depends on the growth temperature (7) and gas pressure (p) inside the chamber. The mean free path of a species can be calculated using the following expression:

$$\lambda = \frac{kT}{\pi a_o^2 p \sqrt{2}}, \quad (2)$$

where $a_o$ denotes the gas molecule's diameter, and k is the Boltzmann constant. Thus, when equation (2) is substituted in equation (1) the following equation is obtained for the species energy E:

$$E = E_o \exp\left(-\frac{\pi a_o^2 p d \sqrt{2}}{kT}\right). \quad (3)$$

This equation is used in step 200 to select the species energy, based on the structure that is desired to be formed, for example, 1 D, 2D or film structures. Based on this relationship, an optimized pressure p is selected, which in this case corresponds to a nitrogen pressure ($p_{N2}$)≥150 mTorr for a distance d=7-9 cm between the target and the substrate. An optimized initial species energy $E_o$ (equivalent to the laser fluence of 0.9-1 J/cm$^2$) is also selected so that the ablated species experiences high scattering due to the large number of collisions with nitrogen molecules (represented by $a_o$ in Equation (3)). If the energy E of the species is selected to be a low energy, as only species with such energy land on the substrate 105, the Stranski-Krastanov nucleation is achieved for the nanowire formation, thus leading to the growth of the desired nanofeatures (e.g., nanowire, nanorod, nanotube) without catalysis or seeding, irrespective of the substrate type and its lattice mismatch with the grown materials. In this respect, it is observed from Equation (3) that the species energy E does not depend on the substrate's type used to form the nanowires, which is confirmed by the findings presented herein.

In order to confirm this conclusion, gallium nitride (GaN) nanowires were grown on different conductive, insulator, transparent and opaque (doped or undoped) substrates, including a silicon substrate, gallium nitride substrate, sapphire substrate, gallium oxide substrates, zinc oxide substrate, MXene substrate, graphene substrate, molybdenum disulfide substrate ($MoS_2$), and tungsten diselenide ($WSe_2$) and other bulk (3D) and 2D substrates. As it will be evident from the discussion below, these are merely examples of the types of substrates that can be used to grow semiconductor nanowires, however any substrate can be used. Similarly, the example of gallium nitride nanowires is equally applicable to other group-III elements, including aluminum, boron, and indium and also other types of semiconductors, as previously discussed.

The nanowires growth was achieved in one embodiment by using a Pioneer 240 PLD system (Neocera) equipped with a KrF excimer laser (of 248 nm wavelength) to ablate a commercial GaN target (99.95% purity) of 2.5 cm diameter. The different substrates used to grow the NW are: a single-side-polished p-type Si (100), a single-layer graphene/90 nm $SiO_2$/highly (100) p-doped Si wafer, a doped gallium nitride layer grown on a- and c-sapphire, a c-sapphire, a doped and undoped gallium oxide, zinc oxide, a $Ti_3C_2$ MXene with ~40 μm particle size deposited on glass by spray-coating, and 2D transition-metal dichalcogenides (TMDs) ($MoS_2$ and $WSe_2$) substrates. All substrates were obtained through commercial channels apart from 2D TMD substrates. For the 2D TMDC substrates, high-quality monolayer transition-metal dichalcogenides were synthesized on sapphire substrates by a typical chemical vapor deposition (CVD) method in a hot-wall furnace. High-purity tungsten trioxide ($WO_3$) (e.g., 99.9%), molybdenum trioxide ($MoO_3$) (e.g., 99.5%), selenium (Se) (e.g., 99.99%) and sulfur (S) (e.g., 99.5%) powders were used as precursors. The growth temperatures for WSe2 and $MoS_2$ were 900 and 800° C., respectively. Argon (Ar) and argon/hydrogen (Ar/H$_2$) flowing gas was used as carrier gas for MoS$_2$ and WSe$_2$ growth, respectively. All the growths were performed at low pressure (10-40 Torr).

In order to grow the gallium nitride nanowires on the different substrates (p-Si and graphene), the target was exposed to the laser beam to ablate the species towards substrates under the pulsed laser deposition conditions in Table 1 below.

TABLE 1

| Substance Temp. | 850° C. | Laser Energy | 95-100 mJ |
|---|---|---|---|
| Distance Between Target and Substrate | 9 cm | Pulse duration | 100,000 |
| Gas Pressure | 250 mTorr | Pre-Ablation | 1,000 pulses |

For other substrates, these conditions need to be adjusted accordingly. For example, if the GaN NWs are grown on a GaN substrate or sapphire (both in c-direction and a-direction), the conditions shown in Table 2 are used:

TABLE 2

| Substance Temp. | 850° C. | Laser Energy | 95-102 mJ |
|---|---|---|---|
| Distance Between Target and Substrate | 9 cm | Pulse duration | 100,000 |
| Gas Pressure | 150 to 250 mTorr | Pre-Ablation | 1,000 pulses |

For both examples presented in Tables 1 and 2, the laser pulses may be delivered at a frequency of 10 Hz. One skilled in the art would understand that by varying any of these conditions by 20 to 30% relative to the values presented in the two tables, it would still be able to obtain the high-quality nanofeatures discussed herein.

Figure 4A:
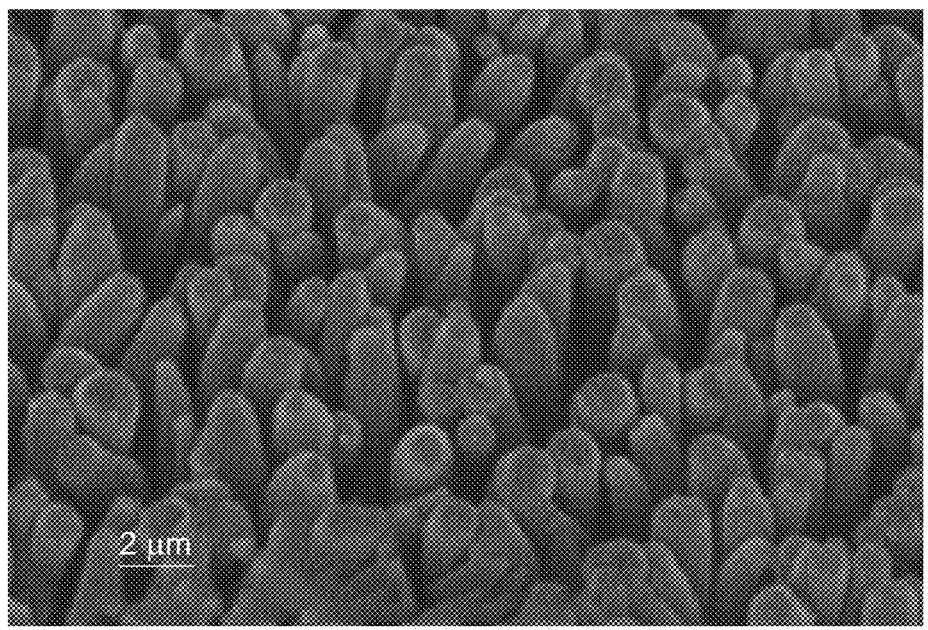
FIGS. 4A-4G are scanning electron microscope (SEM) images of III-nitride nanowires grown on a variety of different substrates.
Figure 4B:
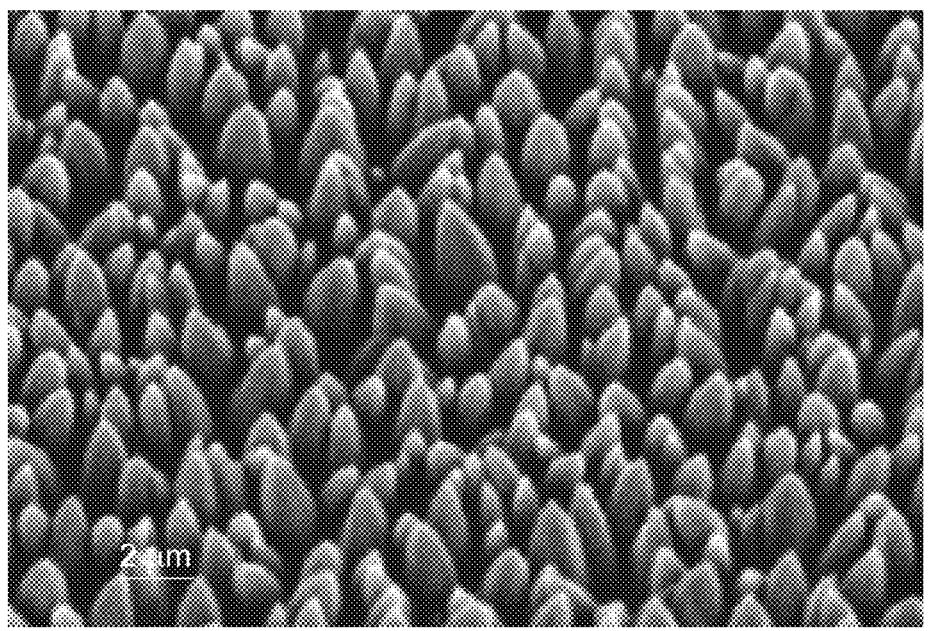
Figure 4C:
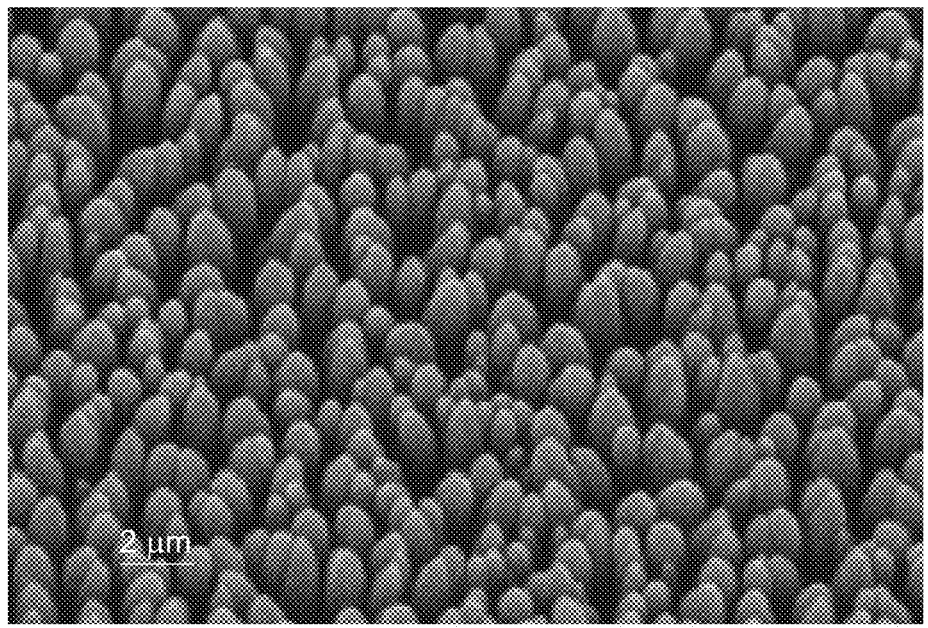
Figure 4D:
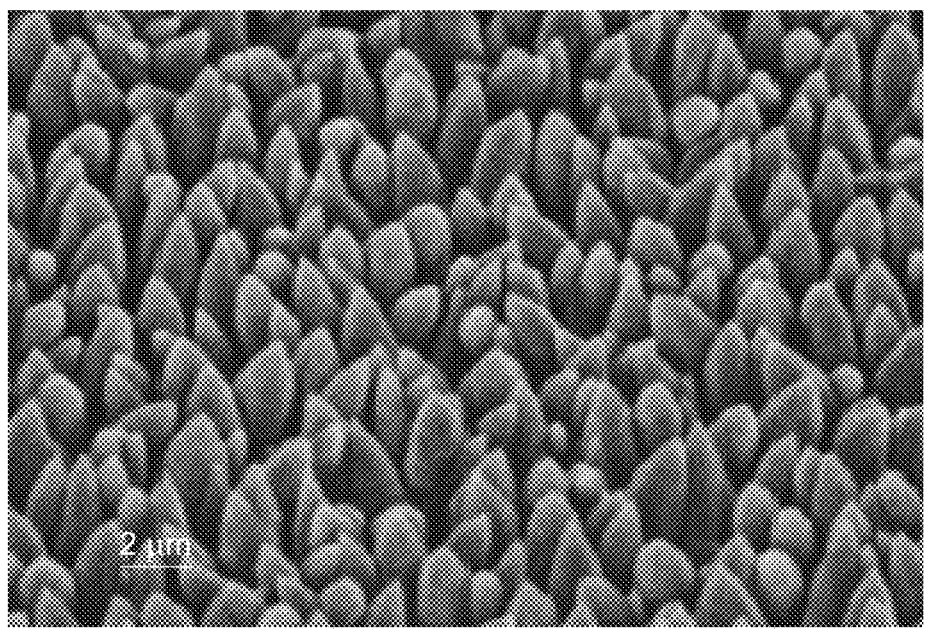
Figure 4E:
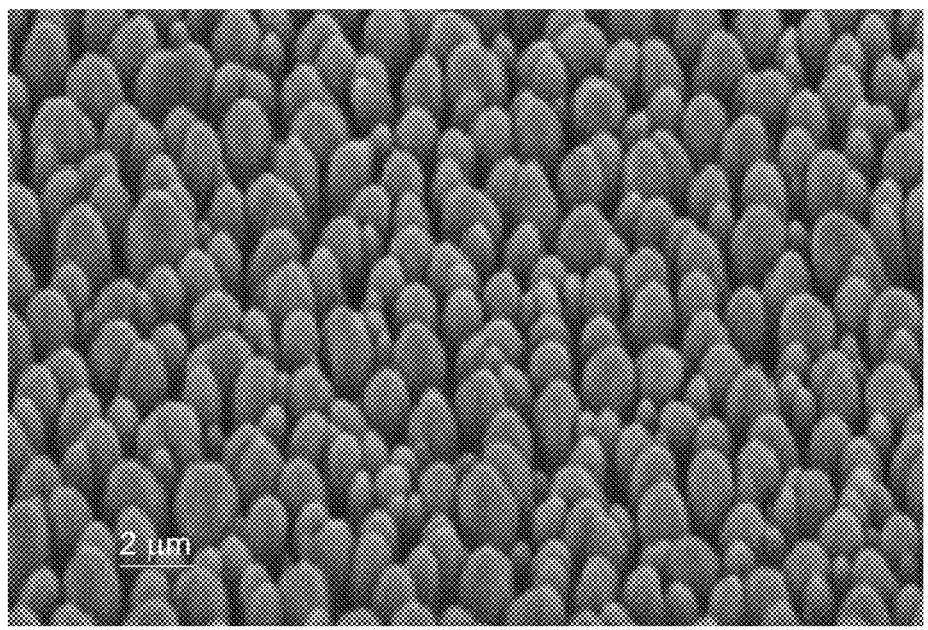
Figure 4F:
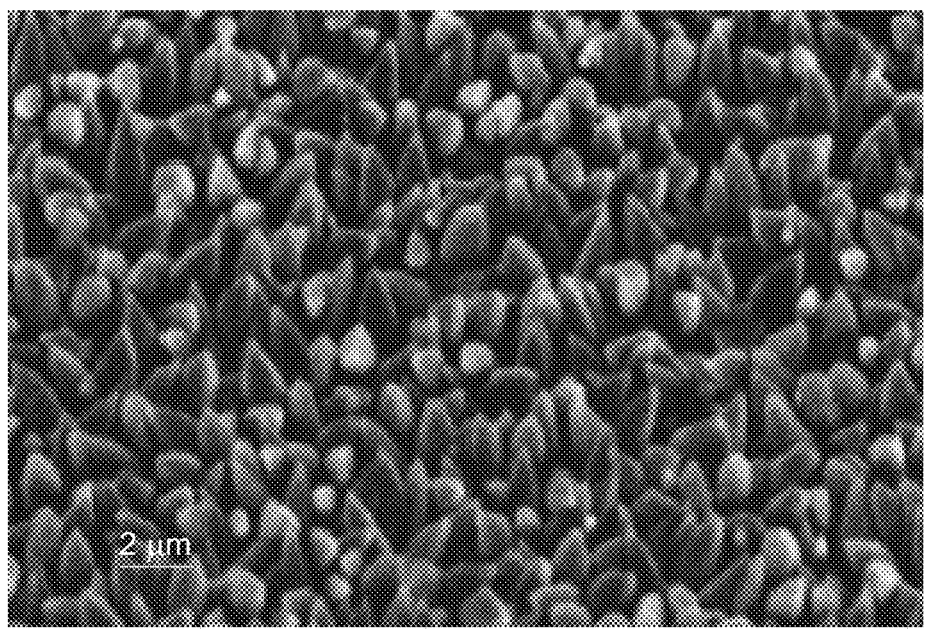
Figure 4G:
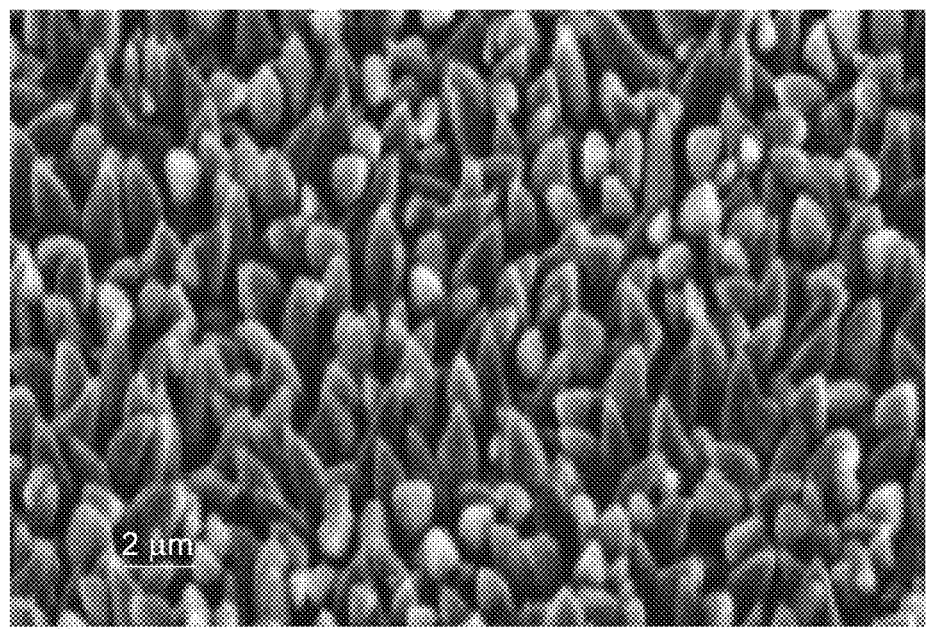

Scanning electron microscope (SEM) images of III-nitride nanowires grown on the different substrates are illustrated in FIGS. 4A-4G. Specifically, FIG. 4A illustrates gallium nitride nanowires grown on a silicon substrate, FIG. 4B illustrates gallium nitride nanowires grown on a gallium nitride substrate, FIG. 4C illustrates gallium nitride nanowires grown on a sapphire substrate, FIG. 4D illustrates gallium nitride nanowires grown on a MXene substrate, FIG. 4E illustrates gallium nitride nanowires grown on a graphene substrate, FIG. 4F illustrates gallium nitride nanowires grown on a molybdenum disulfide substrate, and FIG. 4G illustrates gallium nitride nanowires grown on a tungsten diselenide substrate. It is believed that this is the first time that gallium nitride nanowires have been grown on two-dimensional substrates, such as MXene, graphene, molybdenum disulfide substrate, and tungsten diselenide, by PLD. Thus, regardless of the lattice mismatch between the semiconductor of the nanowires and the substrate, by selecting the pulsed laser deposition conditions based on equation (3), to achieve Stranski-Krastanov nucleation, vertical self-assembly, threading dislocation-free, semiconductor nanowires were achieved using a single step pulsed laser deposition process.

Testing also revealed that the diameter and length of the nanowires can be tuned by adjusting the pulsed laser deposition conditions, for example, controlling the number of pulses of the laser 124. As the number of pulses is increasing, the length and diameter of the nanowires is increased. Specifically, testing showed it was possible to grow two different types of gallium nitride nanowires on a p-type silicon substrate. The first type had a length of approximately 900 nm and diameters ranging between 126 and 160 nm, and the second type had a length of 2.9 μm and a diameter ranging between 310 and 360 nm. The quality of the NW was not affected by the change in the number of pulses.

The gallium nitride nanowires grown on the various substrates discussed above were subjected to a variety of evaluations. Evaluation of the structural properties employed a scanning electron microscopy (SEM), scanning transmission electron microscopy (STEM), high-resolution X-ray powder diffraction (XRD) and Raman measurements. Energy disruptive x-ray analysis (EDX) spectroscopy was performed in the transmission electron microscope (TEM) apparatus to determine the nanowire composition. Transmission electron microscope (TEM) lamellae were also studied.

Figure 5A:
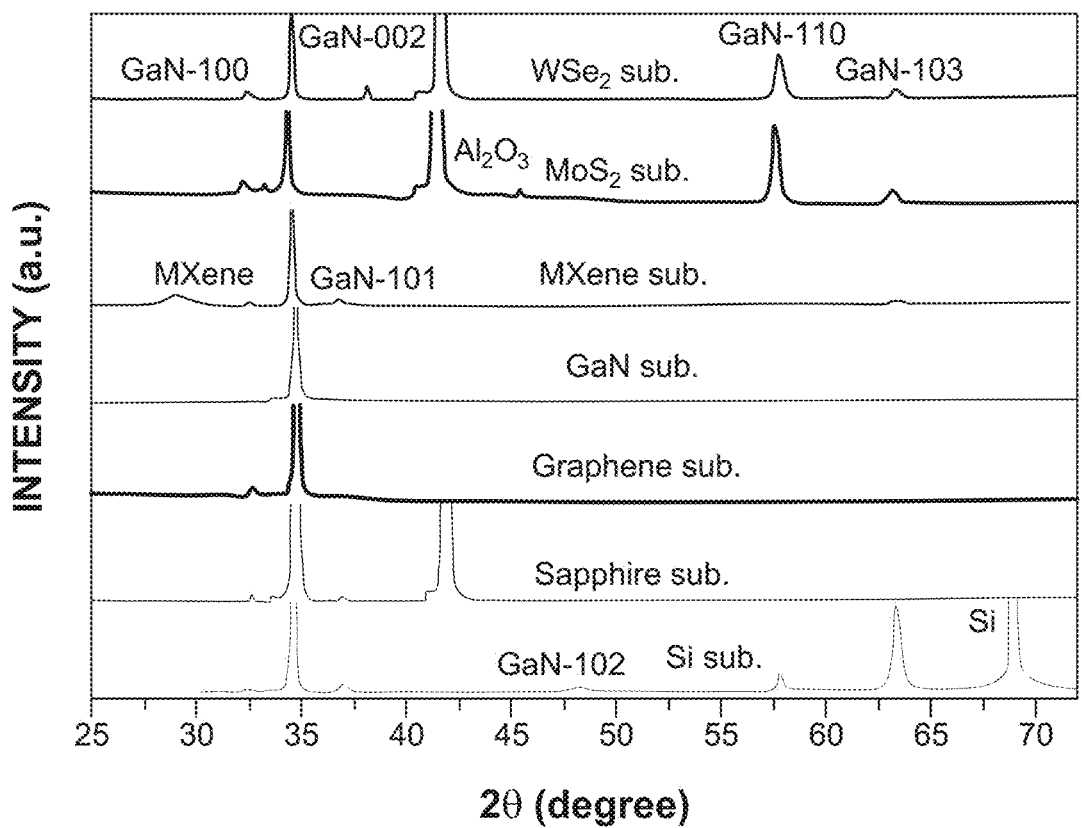

FIG. 5A shows the crystalline structures of the GaN NWs grown on all substrates. These XRD spectra show GaN peaks at 32.6°, 34.6°, 36.9°, 57.8° and 63.5°, which are assigned to the (100), (002), (101), (110) and (103) planes of GaN, respectively, thus confirming the hexagonal wurtzite structure (ICDD 50-0792). However, (002) is the dominant peak and originates from the single-crystal NWs, whereas the other peaks are produced by the wetting layer (WL) formed between the NWs and substrates. As the graphene, MoS$_2$, and WSe$_2$ monolayers are ultra-thin to be detected, the corresponding peaks cannot be discerned from the XRD spectra. These findings further indicate that the (002) peak shifts to the larger angle as the NW diameter decreases due to compressed strain, which is in line with the results obtained in previous studies.

Figure 5B:
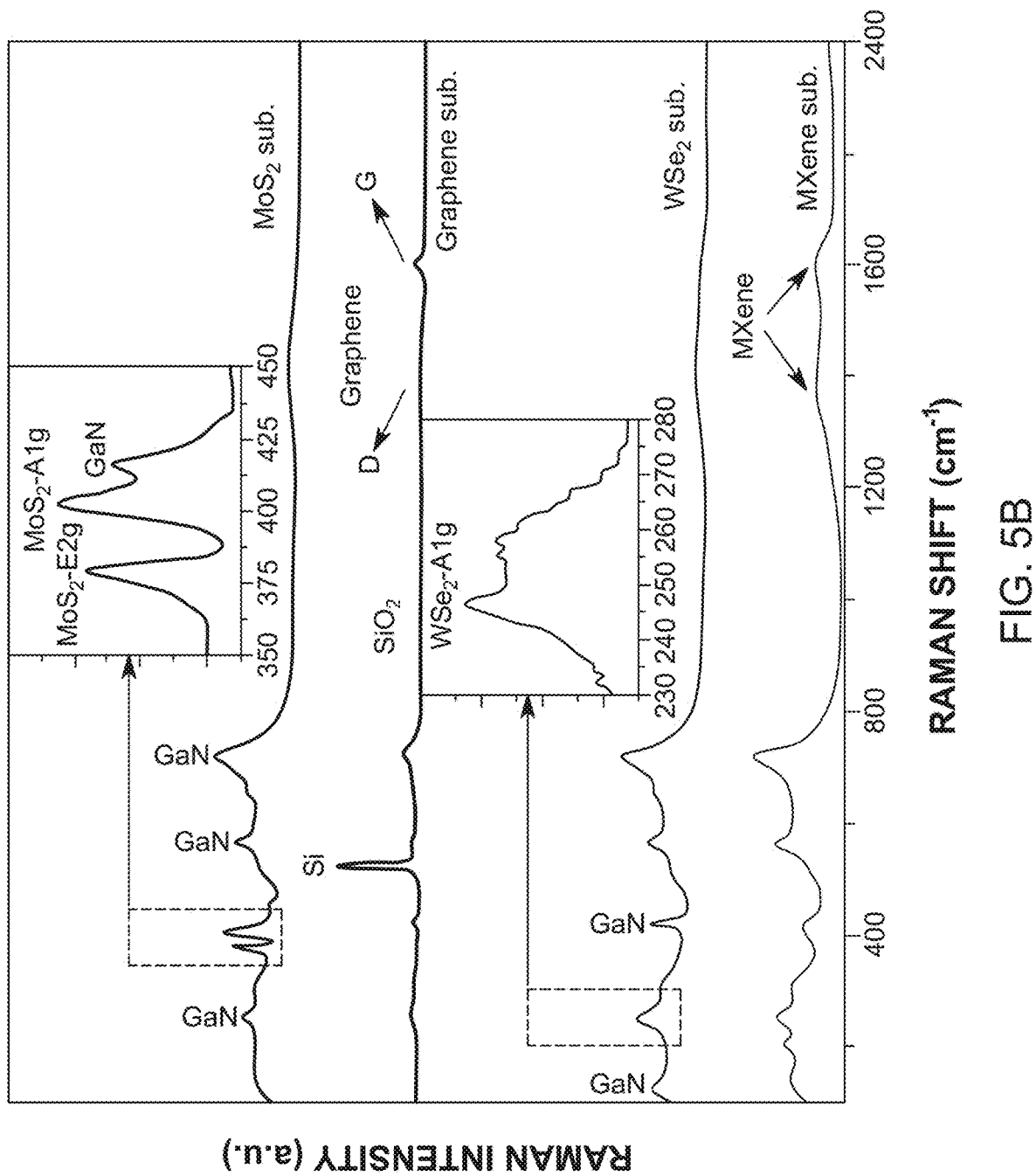
FIG. 5B illustrates Raman spectral of the nanowires grown on various 2D substrates.

FIG. 5B shows the Raman spectra of GaN NWs grown on the 2D substrates, revealing that typical Raman peaks corresponding to GaN (located at 142, 258, 421, 565 and 724 cm$^{-1}$) are obtained with a slight shift compared to a bulk substrate due to the strain experienced by NW structure, which also depends on the NW diameter. Graphene Raman peaks are observed at 1366 cm$^{-1}$ (D) and 1600 cm$^{-1}$ (G), while MXene peaks are observed at 1386 and 1590 cm$^{-1}$. For NWs grown on the TMD substrates, the MoS$_2$ Raman peaks at 380 cm$^{-1}$ (E2g) and at 403 cm$^{-1}$ (A1g) are shown, while WSe$_2$ (A1g) peak is shown at 18 246.5 cm$^{-1}$. No significant differences in the Raman spectra of 2D substrates obtained before and after GaN NW growth are observed when compared to literature and the Raman spectra of bare MoS$_2$ and WSe$_2$, thus demonstrating that the initial 2D substrate crystallinity was well maintained, and that the GaN growth temperature does not affect the nature of the 2D materials. However, a slight shift was observed, and it is associated with the change in 2D bond length, owing to the heterostructure formation.

Material optical properties were examined by photoluminescence (PL) measurements at 5 K and room temperature by using a 325 nm continuous-wave (CW) He—Cd laser, while a spectrograph connected to a charge-coupled device camera was used to collect the data. Reverberation time (RT) absorption measurements were carried out using a UV spectrophotometer, in order to identify any absorption edges that could be attributed to the samples. Pulsed power-dependent photoluminescence (PDPL) measurements at 10 K and room temperature (290 K) were carried out using a 266 nm laser and the obtained photoluminescence emission signal was detected by a highly sensitive spectrometer with the acquisition time fixed to 500 ms for 30 integrations. A closed cycle cryostat was used for low temperature photoluminescence measurements. Reverberation time cathodoluminescence (RT CL) hyperspectral imaging was carried out using a custom-built acquisition system in a scanning electron microscope (SEM), using 5 kV and an acquisition time of 100 ms/pixel.

Extensive scanning transmission electron microscopy (STEM) and Energy-dispersive X-ray (EDX) spectroscopy measurements were performed on the gallium nitride nanowires grown on all substrates to better understand the growth mechanism. The STEM images showed that a ~200 nm thick polycrystalline gallium nitride wetting layer was formed below the gallium nitride nanowires grown on the silicon (100) and sapphire substrates, respectively. Interestingly, the interface between the gallium nitride nanowires and the substrates revealed that during one-step pulsed laser deposition growth an in situ nano-layer of about 2 nm, with homogeneous thickness, formed above the substrate. This nano-layer acts as a catalysis layer to assist in growing the wetting layer, facilitating nanowire growth via Stranski-Krastanov nucleation method, for all substrates. The homogeneity of the interface nano-layer assists in the formation of homogenous gallium nitride nanowires. In contrast, prior pulsed laser deposition techniques for forming III-nitride nanowires required the formation of a metal catalyst or a seed layer on the substrate prior to growing the nanowires, which introduced impurities into the nanowires that affected device performance.

In order to further confirm the nature of the interface nano-layer, the EDX maps of the chemical compositions of the sample on silicon were performed. This nano-layer contains gallium (Ga), nitrogen (N), and silicon oxide ($SO_2$). A similar layer with oxide in its composition was formed during the growth on the interface between the wetting layer and sapphire and gallium nitride substrates. These findings indicate that this in-situ nano-layer performs the function of the gadolinium (Gd) in-situ layer formed under in vertical zinc oxide (ZnO) nanowires during pulsed laser deposition growth disclosed in US Patent Application Publication No. 2018/0222766 A1. It is known that the surface energy is associated with the intermolecular forces at the interface between two surfaces. Different processes (growing nucleation) governed by the substrate surface energy and the interface energy between the substrate and the growing islands can be employed to promote the Stranski-Krastanov nucleation. Thus, it is believed that the growing nucleation was controlled by modulating the species energy to obtain nanowires through the Stranski-Krastanov method.

Figure 6A:
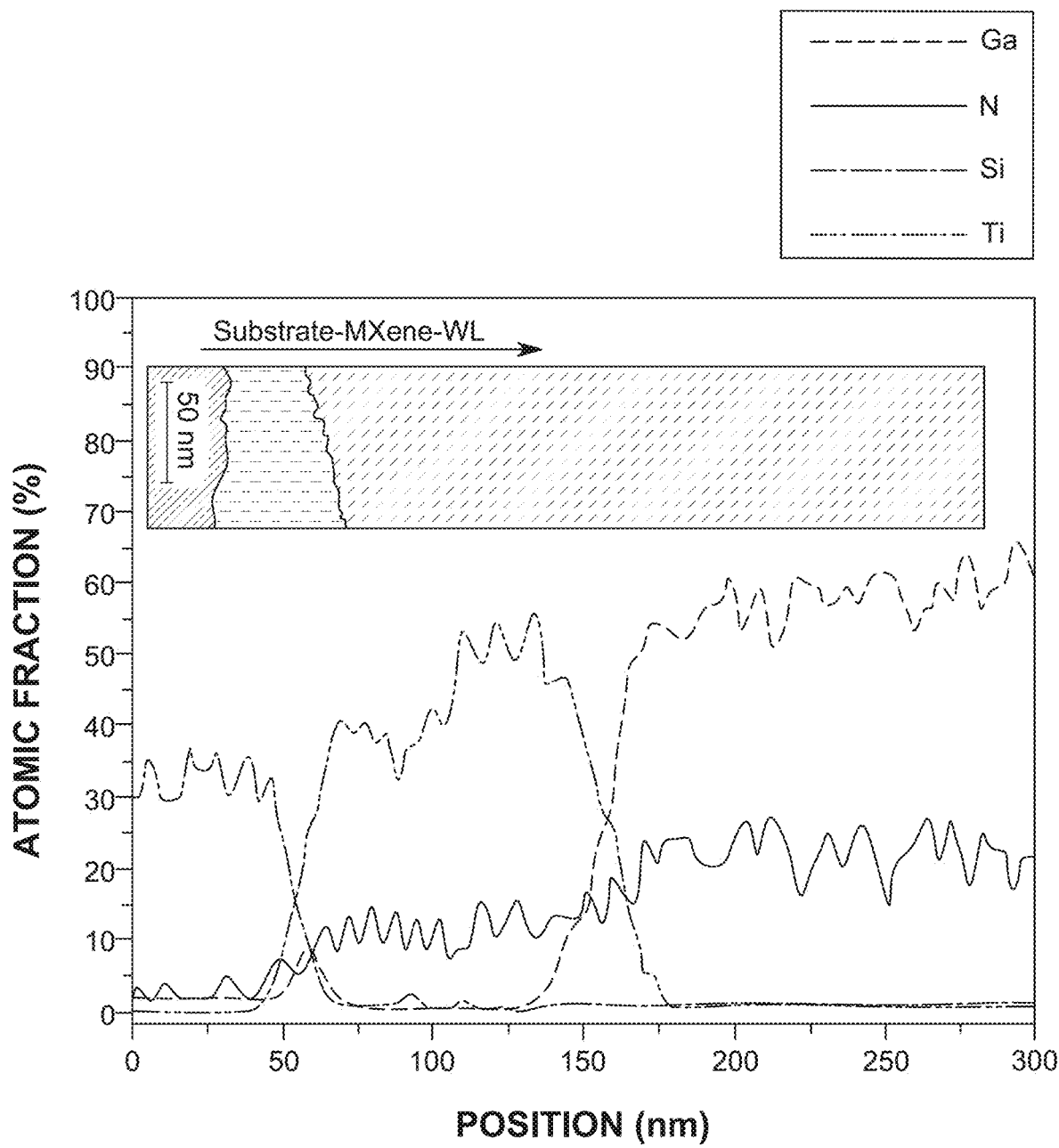
FIGS. 6A and 6B illustrate X-ray powder diffraction maps and profiles of corresponding scanning transmission electron microscopy images for nanowires samples grown on a MXene substrate and a $MoS_2$ substrate, respectively.
Figure 6B:
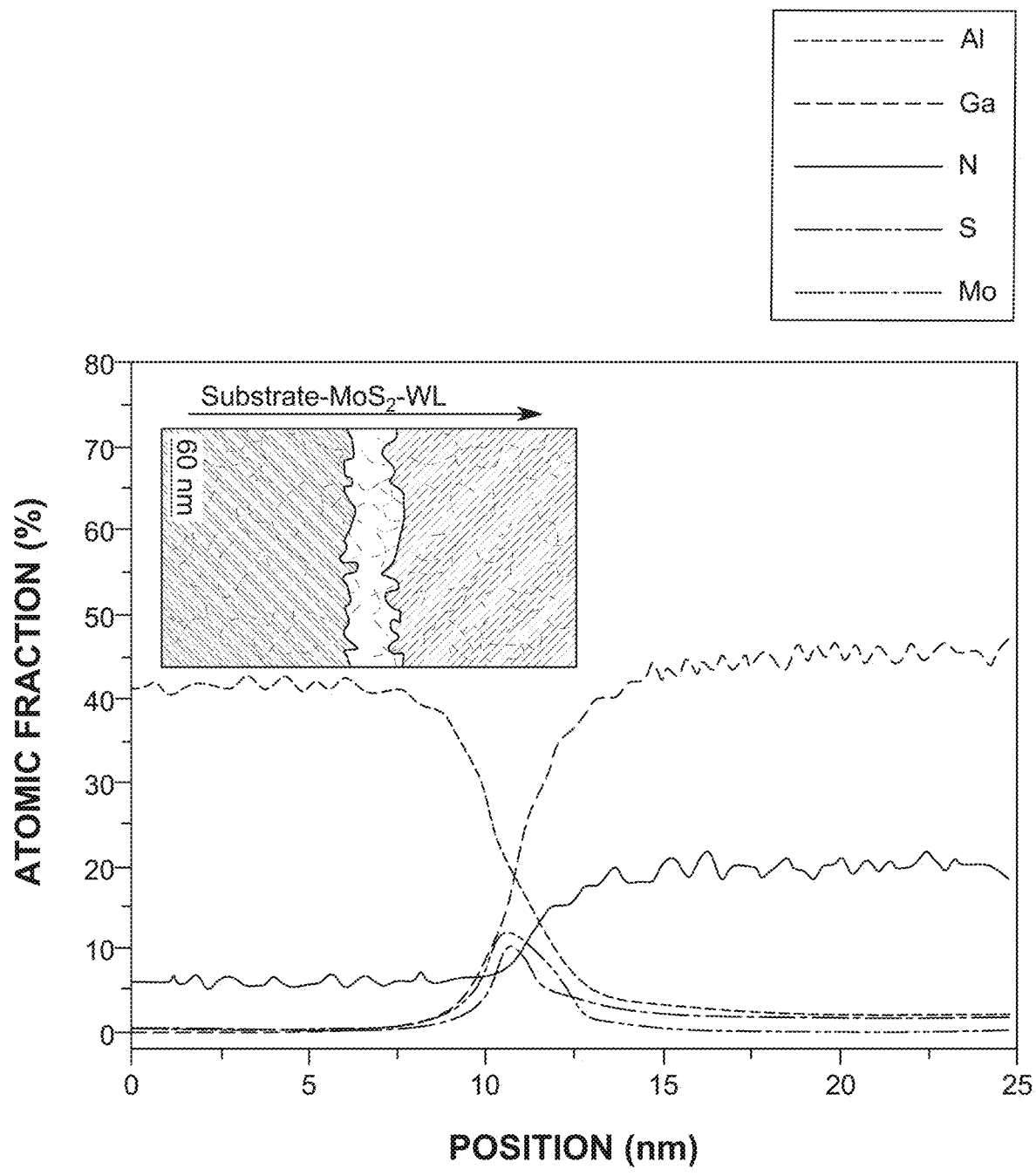

Because gallium nitride nanowires grown on MXene and TMD (e.g. $MoS_2$) substrates have not been previously reported, the growth of GaN NWs on these substrates will be addressed in the following. FIGS. 6A and 6B show the cross-sectional STEM images and related EDX maps, as well as elemental profiles of samples grown on MXene and TMD (e.g. $MoS_2$), respectively, and they confirm the formation of the wetting layer above the 2D substrates, which facilitates the growth of the gallium nitride nanowires. The gallium nitride nanowires grown on graphene substrates further revealed that similar results were obtained for all bulk and 2D substrates. Thus, the 2D substrates (graphene, MXene, $MoS_2$ and $WSe_2$) can serve as an in situ nano-layer to form a vertical nanowire structure. For nanowires grown on 2D substrates, the semiconductor nanowire formation was attributed to the weak quasi Van der Waals interactions between the 3D material and the 2D substrates.

The method discussed above produced dislocation-free single-crystal NW. To confirm this structure, STEM measurements were carried out to demonstrate the quality of the gallium nitride samples. These measurements demonstrated that the vertically aligned gallium nitride nanowires were of a high quality and exhibited a single-crystal structure, which was confirmed by Fast Fourier Transform (FFT) patterns. The STEM images of gallium nitride nanowires grown on MXene and $MoS_2$ substrates exhibited similar results, thus demonstrating that high-quality, single crystal gallium nitride nanowires can be grown on 2D substrates. The single gallium nitride crystallinity was confirmed for the gallium nitride nanowires grown on other substrates, which further confirms that gallium nitride nanowires can be formed in any bulk substrate and 2D substrates.

Surprisingly, the STEM results reveal, for the first time, a complete absence of the threading dislocations in both the wetting layer and the gallium nitride nanowires, irrespective of the degree of lattice match/mismatch between the gallium nitride and the respective bulk or 2D substrate. Because the gallium nitride wetting layer has a polycrystalline nature characterized by nano-grains, the absence of threading dislocations can be attributed to the wetting layer polycrystallinity. This is a significant achievement for the gallium nitride in particular, and for the semiconductor industry in general, given that threading dislocations are always present in gallium nitride and other III-nitrides grown on these substrates due to the large lattice mismatch.

To explore the process underpinning the transformation from poly-(in the wetting layer) to single-crystallinity (in in the nanowires), STEM measurements were performed at different locations situated progressively vertically further away from the substrate interface, which demonstrated that the polycrystalline characteristics diminish as the distance along the c-axis increases from the substrate, moving towards the gallium nitride nanowires, while the single-crystalline along c-direction is retained in the nanowires. The STEM images of the gallium nitride nanowires grown on MXene and MoS2 substrates and the corresponding HR-STEM images and FFT patterns demonstrate that these exemplary 2D substrates produced high-quality of threading dislocation-free single-crystal gallium nitride nanowires, which is similar to the results and growth mechanisms to those shown for bulk substrates. These findings proved that the disclosed growth method eliminates threading dislocations in semiconductor nanowires grown on a wide range of (conductive, insulator, transparent or not transparent) bulk and 2D substrates, allowing the method to be adopted for high performance semiconductor-based devices intended for any optic or opto-electronic application.

Figure 7:
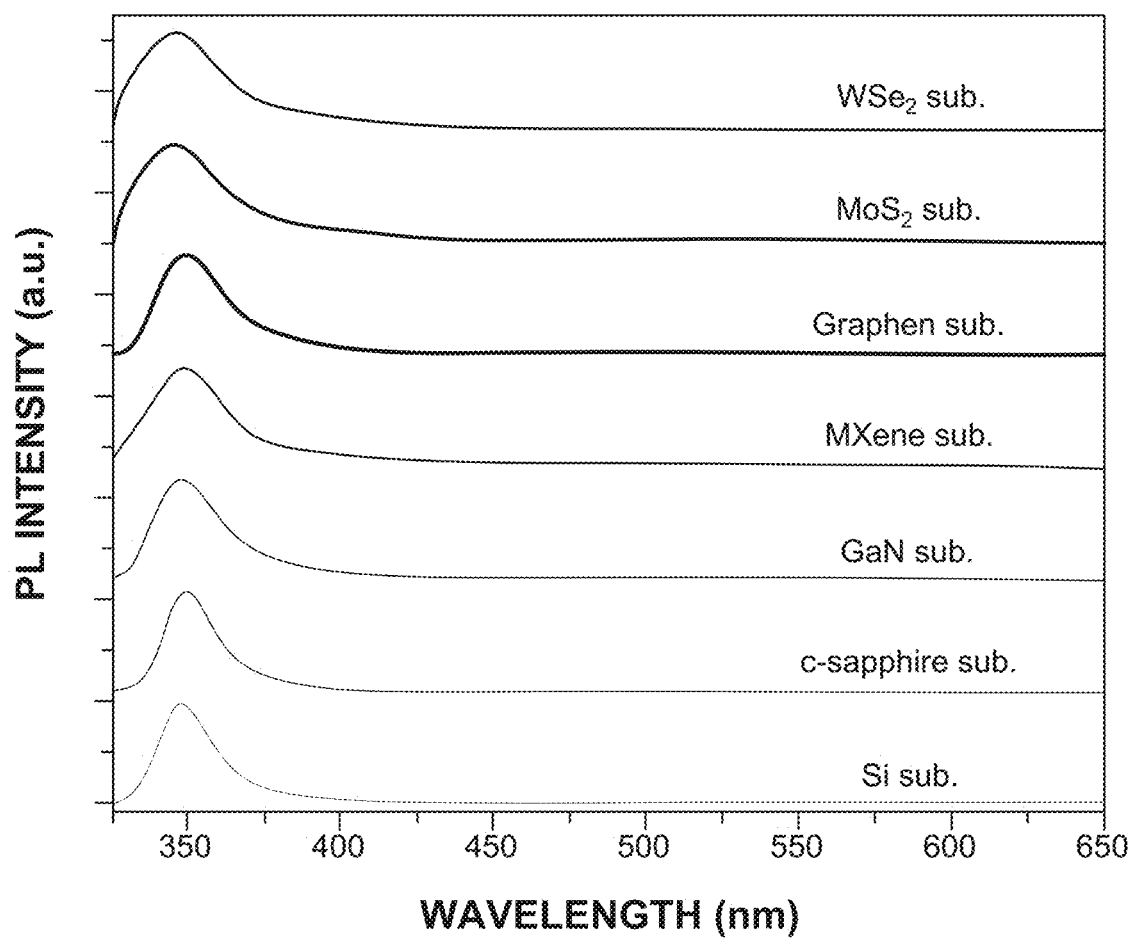
FIG. 7 shows photoluminescence results for the GaN nanowires grown on various substrates.

To study the optical properties of the NW grown with the method discussed above, absorption and photoluminescence (PL) measurements (see FIG. 7) were performed on the gallium nitride nanowires. These measurements confirmed that gallium nitride nanowires grown on silicon and sapphire substrates produced a sharp absorption edge. Typical absorption curves were obtained for the gallium nitride nanowires grown on all the substrates discussed above. The absorption results confirmed that the bandgap energy is around ~3.58 eV and ~3.68 eV for samples grown on c-sapphire and silicon substrates, respectively. The observed slight shift in the absorption edge for gallium nitride nanowires grown on different substrates can be due to the different nanowire diameters (i.e., different compressed strain) for growth on different substrates, as confirmed by the XRD and SEM results. To further confirm the optical quality of the obtained gallium nitride nanowires, temperature- and power-dependent PL measurements were performed. The room temperature (RT) photoluminescence spectra, which is illustrated in FIG. 7, exhibits a sharp dominant gallium nitride near band edge (NBE) emission at 346-350 nm for all gallium nitride nanowires grown on all substrates, along with a negligible defect band (yellow band), confirming superior optical quality, which is in line with the sharp absorption edge and STEM results, thus demonstrating the success of the disclosed growth method.

In order to identify the cause of the very broad intense photoluminescence emission with a negligible yellow band, room temperature cathodoluminescence (CL) hyperspectral imaging was performed in order to spatially resolve the emission from the wetting layer and nanowire regions. Cathodoluminescence maps were created from the cross-section structure of the gallium nitride nanowires on different substrates. The cathodoluminescence map for the sapphire substrate sample exhibited a spectrally integrated cathodoluminescence intensity map, with clearly marked regions from which area-averaged cathodoluminescence spectra were extracted. The cathodoluminescence spectrum averaged over an area containing only gallium nitride nanowires showed a sharp peak at 3.6 eV (344 nm) with a full width at half maximum (FWHM) of 0.38 eV, whereas the cathodoluminescence spectrum of the polycrystalline wetting layer showed a broader and blue-shifted peak at 3.8 eV (~326 nm) with a FWHM of 0.43 eV emitted from the polycrystalline wetting layer. A cathodoluminescence spectrum map as a function of distance from the top to the bottom of the sample shown confirmed this finding. The near-band-edge emission peaks originating from the wetting layer were blue-shifted as a result of the nano-grains, leading to quantum dot-like behavior as the average grain size remains below 10 nm (not exceeding the exciton diameter), as was shown in STEM images of the wetting layer, leading to exciton confinement. Therefore, as excitons are confined or localized in these nano-grains, both processes lead to a near-band-edge emission blueshift and an increase in radiative recombination rate. For this reason, the near-band-edge emission arising from both the wetting layer and the nanowires was intense, with a negligible yellow band, as exciton localization/confinement dominates the radiative recombination, boosting material efficiency. Broadening of the near-band-edge emission arising from the wetting layer is expected, as the peaks emitted from different-sized nano-grains overlap, leading to broad emission with no defect band. Such intense peak broadening is important for high-efficiency LED applications, as will be demonstrated by obtaining internal quantum efficiency.

The temperature-dependent photoluminescence spectral of the gallium nitride nanowires showed that the near-band-edge emission was intense at room temperature and 5 K, as the ratio of the integrated intensity at 5 K to that at room temperature was estimated to be ~45%, suggesting high UV efficiency. Therefore, to further confirm the high efficiency of the gallium nitride nanowires, the internal quantum efficiency was calculated using the Shockley-Read-Hall (SRH) method to be 65% through power-dependent photoluminescence (PDPL) measurements, which is considered the most accurate and reliable method for calculating internal quantum efficiency at room temperature. The power-dependent photoluminescence spectra indicated that the near-band-edge emission consisted of two overlapping peaks, in agreement with the cathodoluminescence measurements. The power-dependent internal quantum efficiency as a function of power density (the injected carrier density) at room temperature was calculated.

The internal quantum efficiency curve indicated that the internal quantum efficiency increased rapidly with the excitation energy density due to the saturation of the nonradiative recombination centers by generated carriers, whereby its maximum value (65%) was achieved at ~70 kW/cm$^3$, confirming significant predominance of radiative recombination. However, at higher excitation energy densities, the internal quantum efficiency started to decline, reaching 47% at $1.2 \times 10^3$ kW/cm$^3$, which is still considered high for gallium nitride UV emission, which is consistent with the integrated intensity ratio obtained by temperature-dependent photoluminescence. These results demonstrate the superior optical efficiency of the nanowires grown with the method of FIG. 2 when compared to the state of the art.

To determine the radiative recombination contribution and further identify the reasons behind the droop, the log (Ia) was plotted as a function of the log ($G_{opt}$) (power density) at room temperature and 10 K. According to Equation (4), the dominance of radiative recombination is demonstrated when I∝G (I∝n$^2$), resulting in a rapid increase in the internal quantum efficiency, as the majority of the contribution originates from localized excitons. At room temperature, the (log-log) integrated photoluminescence intensity output as function of power density showed k ~1.2 under a low excitation power density, which further confirmed the significance of the radiative recombination contribution in the total recombination process, with some defect-related nonradiative recombination. On the other hand, at the higher limit of the internal range, the (log-log) integrated photoluminescence intensity output as function of power density showed k=1 at high excitation power density (≥30 kW/cm$^3$) before the droop regime, which confirmed a complete radiative recombination process due to saturation of nonradiative centers. However, in the efficiency droop range, the slope was ~0.89 (>2/3), which indicates that dominant radiative recombination was accompanied by minor Auger recombination contribution, revealing that Auger recombination can be the main reason behind the slight internal quantum efficiency droop.

At low temperature (10 K), the k value of 1-1.1 revealed that radiative recombination completely predominates in both low and high excitation regimes. These results confirm that these highly efficient gallium nitride nanowires have a strong potential for use in a wide range of applications.

Figure 2:
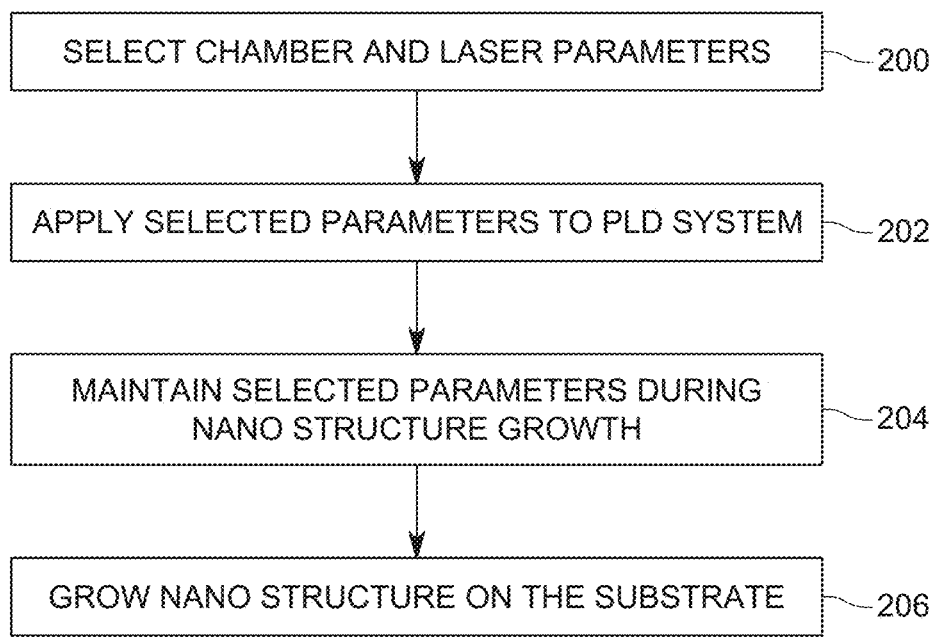
FIG. 2 is a flow diagram of a method for forming a semiconductor device having nanofeatures.

The method of FIG. 2 indicates a successful cost-effective, universal growth methodology of high-quality, TD-free, self-assembly, semiconductor nanowires that are grown on any 2D TMD and bulk substrates, without the need for metal catalyst or seeding, and regardless of the lattice mismatch between the nanostructure and the substrate. The STEM studies discussed above indicate the complete absence of dislocations in the NWs, which is attributed to the high-quality polycrystalline WL, while the NWs exhibit single wurtzite crystal structure. The absence of dislocations in the high-quality NWs as well as the nano-grains in the WL (by acting as exciton localization centers) further enhanced the efficiency of the system. Carrier dynamics measurements on all samples confirmed superior UV efficiency, while a slight droop at high excitation densities is ascribed to a minor contribution from the Auger recombination at high carrier injection rates. These findings suggest that semiconductor NW-based emitting devices, including UV vertical emitting laser diode and flexible devices can now be successfully made based on the novel techniques discussed herein.

Figure 8A:
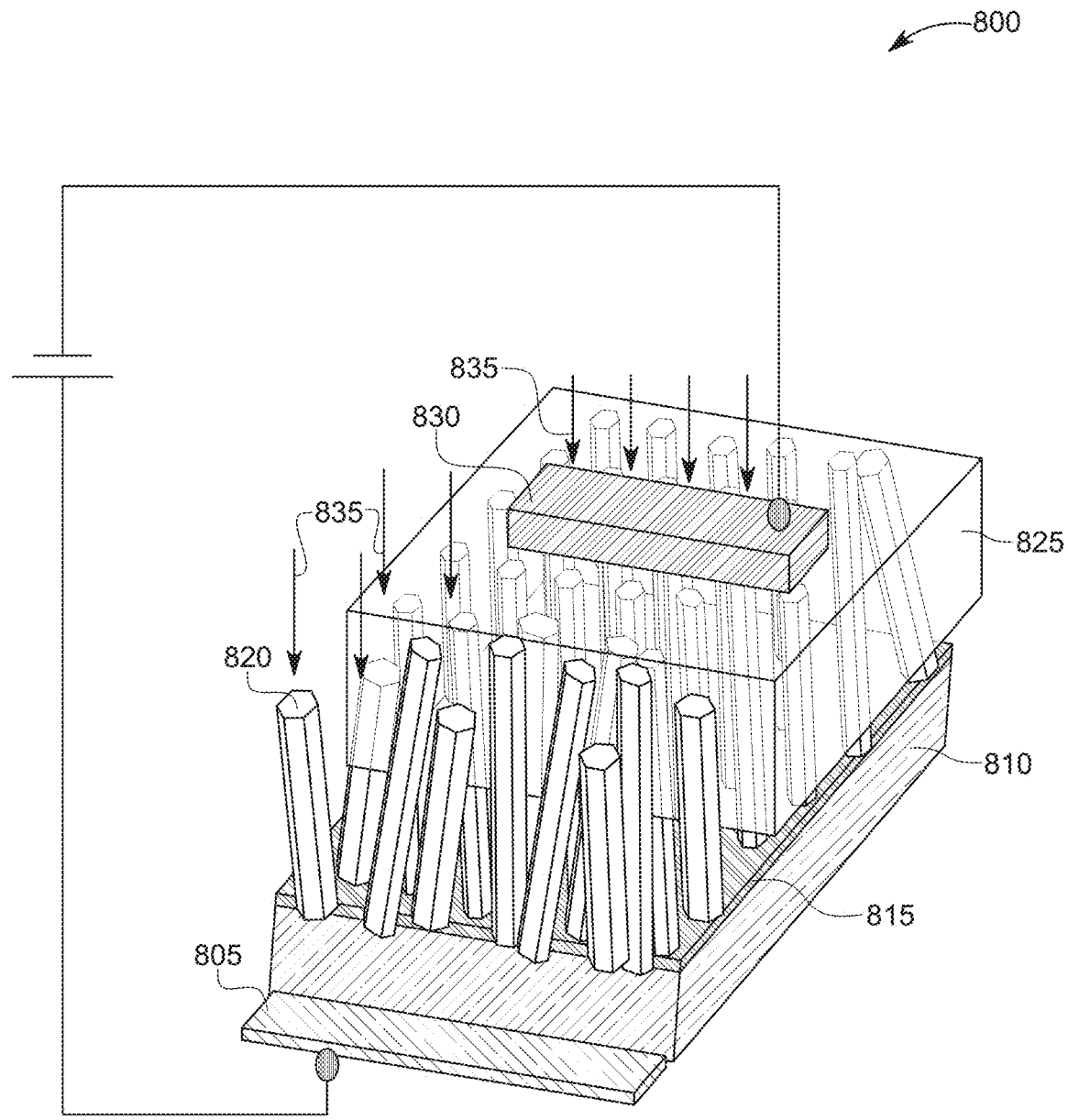
FIG. 8A is a schematic diagram of a semiconductor nanowire based photodetector.
Figure 8B:
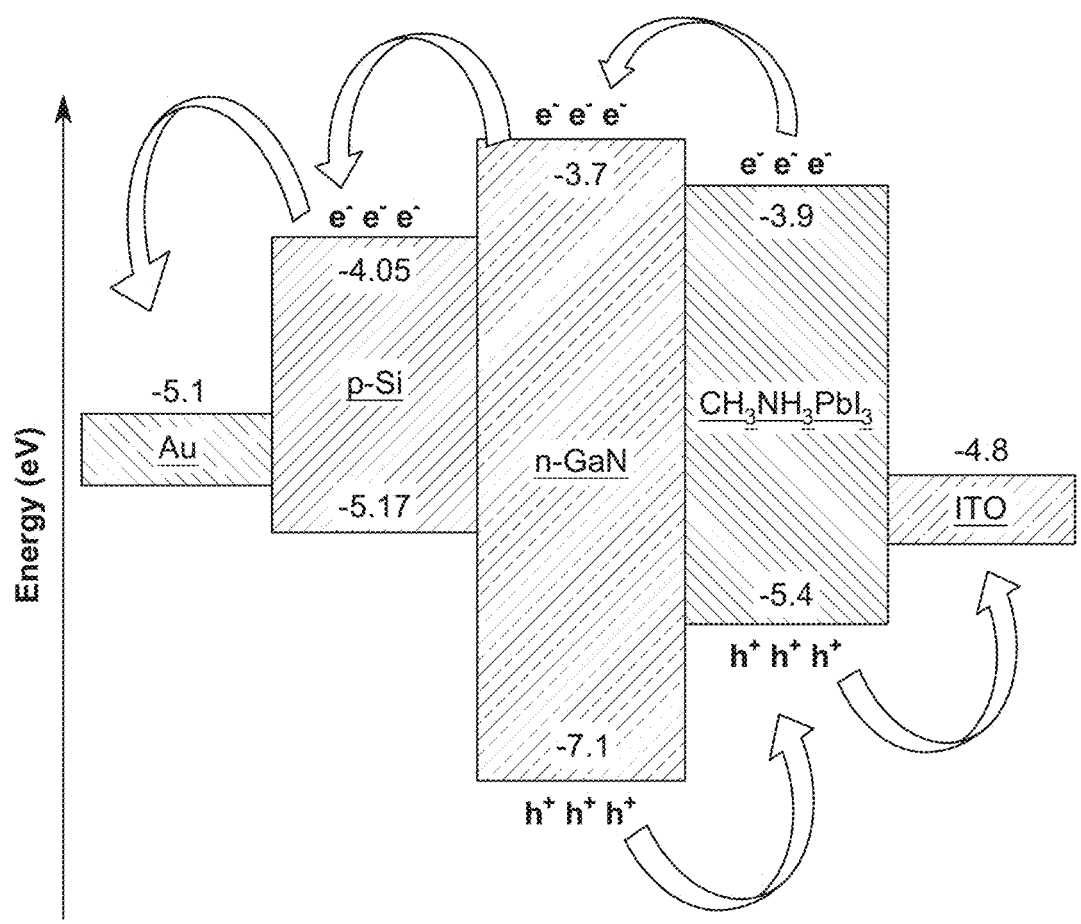
FIG. 8B is an energy band diagram for the photodetector illustrated in FIG. 5A.
Figure 10A:
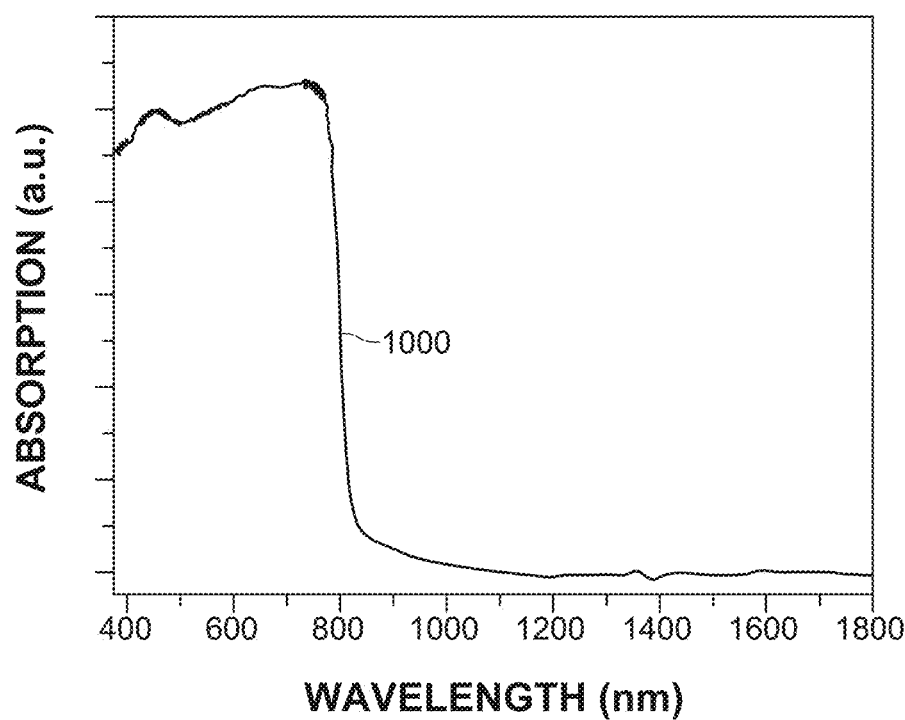
Figure 10B:
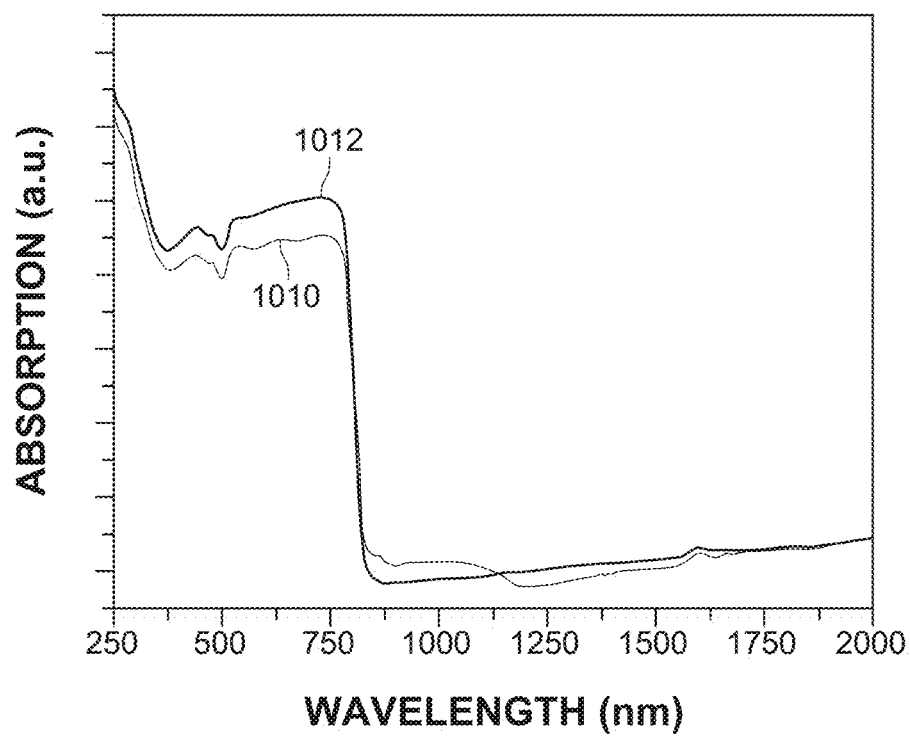
FIG. 10B illustrates the absorbance of a hybrid photodetector that is based on a layer of perovskite but also includes semiconductor nanowires made as shown in FIG. 3.
Figure 11:
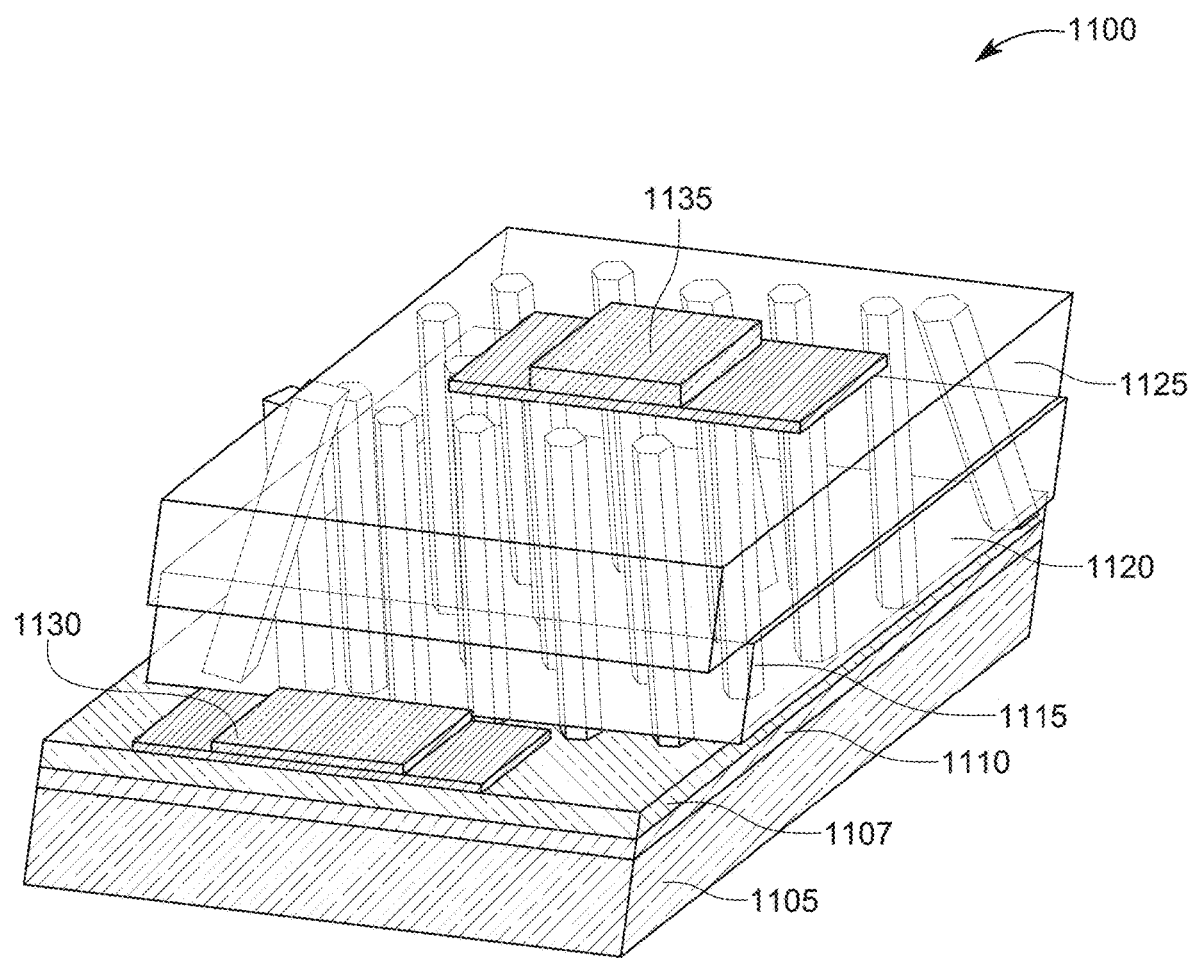
FIG. 11 is a schematic diagram of a semiconductor nanowire based light-emitting diode (LED)

A few examples of such devices are now discussed with regard to FIGS. 8A to 12. Specifically, FIGS. 8A and 9A illustrate photodetectors hybridized with perovskite using NWs grown in any substrates allowing top or bottom contacts, depending on the substrate and optimized structure (lateral and vertical devices), FIGS. 8B and 9B illustrate the energy band diagrams of the photodetectors of FIGS. 8A and 9A, respectively, FIG. 11 illustrates a light-emitting diode, FIG. 12A illustrates a III-nitride MQW-based device formed on top of the GaN NWs, and FIGS. 12B and 12C illustrate single or multiple QW-based LEDs or laser diodes implemented as lateral and vertical devices.

Turning first to FIG. 8A, the photodetector 800 includes a first contact 805 coupled to the bottom of the substrate 810. Note that the detector 800 may also be used as a solar cell. The substrate 810 may be formed of any of the materials discussed above. An interface layer 307 and wetting layer 309, which are represented as a single layer 815 for purposes of clarity, is formed on the substrate 810 as part of the growth process. Semiconductor nanowires 820 (only one of which is labeled for purposes of clarity) are formed on the interface layer and wetting layer 815 based on the method discussed above. At least some of the semiconductor nanowires 820 are covered by a perovskite layer 825, while the other semiconductor nanowires 820 are not covered by the perovskite layer 825. A second contact 830 is arranged on top of the perovskite layer 825. Thus, an electrical connection between the first contact 805 and the second contact 830 can be used to obtain the output from the photodetector 800 due to the incoming light 835 impinging upon the perovskite layer 825 and also directly on the nanowires 820. In a non-limiting example, the first contact 805 can be a gold contact, the substrate 810 can be a silicon substrate, the semiconductor nanowires 820 can be gallium nitride nanowires, the perovskite layer 825 may include organic $CH_3NH_3PbI_3$ or inorganic $PbCsX_3$ and the second contact 830 may include indium tin oxide (ITO).

To prepare the device 800, organic $CH_3NH_3PbI_3$ or inorganic $PbCsX_3$ perovskite powder of 99% purity was used. Note that the method is designed to work with any $ABX_3$ perovskite, but for simplicity, the method is discussed specifically with regard to the organic perovskite $CH_3NH_3PbI_3$. To obtain a uniform perovskite layer, 0.25 M (1M=0.619.9 g/mL) of $CH_3NH_3PbI_3$ perovskite powder were mixed with 1 mL of dimethylformamide (DMF) at 60° C. Then, the perovskite was spray-coated on some of the GaN NWs 820, by a compressed-air brush producing nitrogen gas flow at 1 bar pressure perpendicular to the GaN NWs sample, which was placed on a hot plate at a distance around 15 cm from the brush, before being annealed for 10 min at 100° C. Finally, to deposit the transparent electrode 830, within minutes following the annealing procedure, the sample was transferred directly to Magnetron Sputtering vacuum chamber. For the contact layers, an indium-tin oxide (ITO) layer was deposited as the top electrode on the $CH_3NH_3PbI_3$ perovskite with two types of metal layers by using a shadow mask. Specifically, Au was deposited as the bottom contact 805 on the p-Si substrate 810, whereas an Ag layer served as the top contact 830 with GaN NWs. An ITO thickness of 150 nm was achieved using a radio frequency magnetron sputtering at room temperature (RT), along with argon plasma at 5 mTorr working pressure and a constant current of 0.15 A for 100 minutes.

In another embodiment, if the inorganic perovskite is desired to be used to make the layer 825, then it is possible to use Lead (II) bromide ($PbBr_2$, 99.999% trace metals basis), cesium acetate (CsAc, 99.99% trace metals basis) octylamine (OcAm, 99%), octanoic acid (OcAc, 98%), 1-propanol (PrOH), nhexane (Hex, 99%), and toluene (99.8%) to prepare the $CsPbBr_3$ perovskite. All these chemical materials were utilized without any further purification. $CsPbBr_3$ NCs were synthesized as follow. The Cs precursor and $PbBr_2$ precursor were prepared separately, and the reaction was initiated by injecting the latter into the former. First, Cs precursor solution was prepared by dissolving 32 mg of CsAc in 1 mL of 1-PrOH in a 20 mL vial under stirring in air at room temperature, followed by addition of 6 mL of Hex and 2 mL of 1-PrOH. Second, $PbBr_2$ precursor solution was prepared by dissolving 245 mg of $PbBr_2$ into a mixture solution of 0.45 mL of 1-PrOH, OcAc, and OcAm each at 90° C. in air under vigorous stirring. Third, the hot $PbBr_2$ precursor was injected into the Cs precursor swiftly under vigorous stirring at room temperature. The system turned green immediately, and the reaction completed in 2 min. The $CsPbBr_3$ NCs were isolated by centrifugation at 3000 rpm 4 min, and the pellet was dispersed into 2 mL of toluene. Other methods for forming the perovskite layer 825 may be used.

Figure 9A:
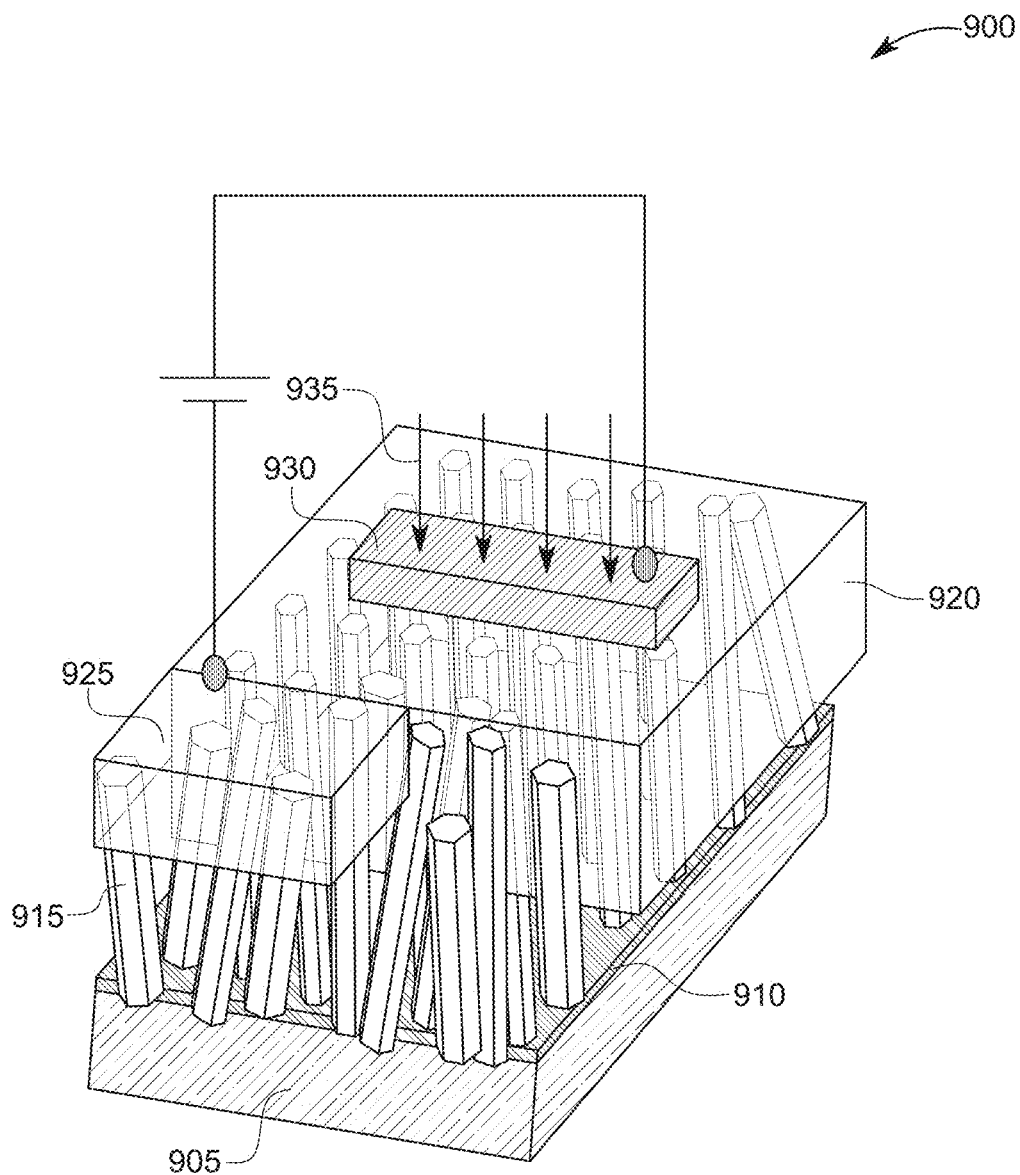
FIG. 9A is a schematic diagram of another semiconductor nanowire based photodetector.
Figure 9B:
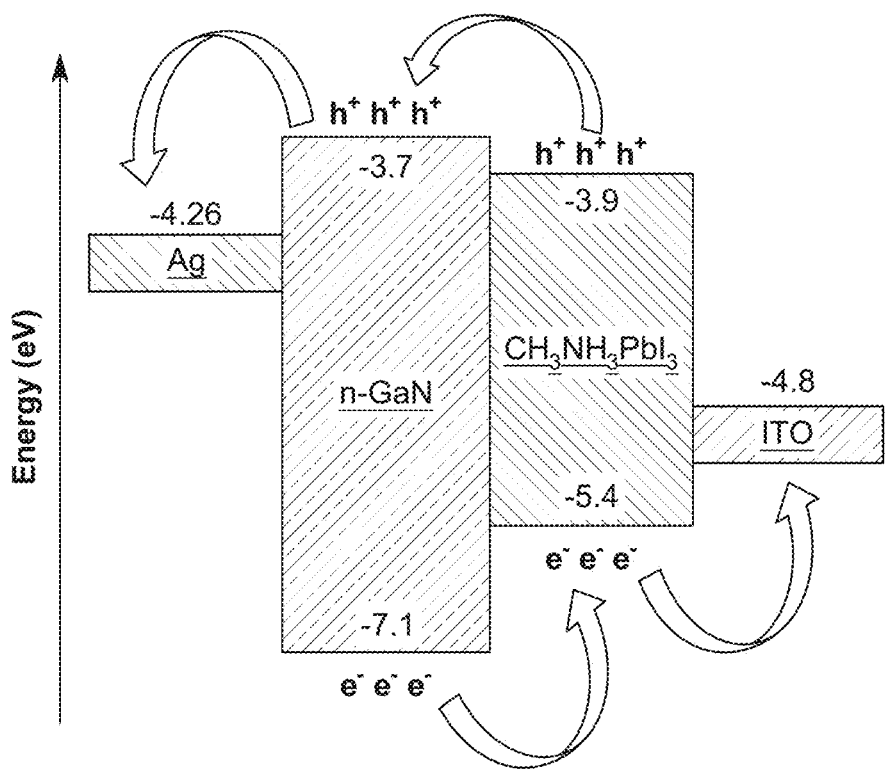
FIG. 9B is an energy band diagram for the photodetector illustrated in FIG. 9A.

Turning now to FIG. 9A, the photodetector 900 (which can also be used as a solar cell) includes a substrate 905 on which an interface layer and wetting layer, which are illustrated a single layer 910 for purposes of clarity, are formed as part of the growth process. Semiconductor nanowires 915 (only one of which is labeled for purposes of clarity) are formed on the interface layer and wetting layer 910. At least some of the nanowires 915 are covered by a perovskite layer 920, while other of the nanowires 915 are not covered by the perovskite layer 920. A first contact 925 is arranged on top of the nanowires 915, which are not covered by the perovskite layer 920 and a second contact 930 is arranged directly on top of the perovskite layer 925. Thus, an electrical connection between the first contact 925 and the second contact 930 can be used to obtain the output from the photodetector 900 due to light 935 impinging the nanowires 915 and the perovskite layer 920. In a non-limiting example, the substrate 905 can be a silicon or graphene substrate, the nanowires 915 can be gallium nitride nanowires, the perovskite layer 920 can include $CH_3NH_3PbI_3$, the first contact 925 can comprise silver and the second contact 930 can comprise indium tin oxide (ITO).

Referring now to both of the photodetectors 800 and 900, indium tin oxide is used as the second contact because it is transparent and allows light to pass through the contact to the underlying semiconductor nanowires. Further, indium tin oxide exhibits additional beneficial attributes, including low electrical resistivity and structural uniformity. The perovskite layer acts as an electron transport layer. Referring now to the energy band diagram of FIG. 8B, the energy band alignment of the semiconductor device 800 guarantees that electrons are injected from the perovskite layer into the gallium nitride nanowire and the electrons are collected by the first contact 805. Referring to the energy band diagram of FIG. 9B, the valence band holes reach the first contact 925 via the III-nitride nanowire.

In both devices, part of the nanowires 820 and 915 are not covered by the perovskite layer for the following reason. The room-temperature (RT) broadband photodetectors (PDs) are widely used in the space science, chemical detection, optical communications, flame sensing, and national defense, among many other fields. Achieving high responsivity and adequate strength in the UV spectral range remains a challenge compared to the visible range. This has prompted researchers to consider hybridizing solution-processed organometallic halide perovskites ($MAPbX_3$, X=I, Br, Cl) or all inorganic halide perovskites ($PbCsX_3$, X is halide) with wide bandgap semiconductors when fabricating high-performance devices at a relatively low-cost to improve the detection in UV range. One of these organometallic halide perovskites, namely $CH_3NH_3PbI_3$, methylammonium lead iodide ($MAPbI_3$), is especially important due to its suitable direct bandgap, a wide absorption area, and high charge carrier mobility. Several works reported on perovskite/ZnO based photodetectors.

An alknorganic cesium lead halide (CsPbX$_3$) perovskite without any organic moiety has emerged as an alternative candidate for the next-generation optoelectronic applications due to its superior stability compared to hybrid perovskites. One or more advantages of this material are the high quantum yield (up to 90%), tunable photoluminescence (PL) emission spectra over the entire visible range with narrow line width, suppressed PL blinking, high carrier mobility, and large diffusion length. As compact and smooth carrier channels are required for high device performance, it is essential that the perovskite active layer is of high crystal quality.

However, the interaction of the perovskite with oxygen in the atmospheric moisture and metal oxide materials, leads to perovskite degradation and thus the device's performance degradation. Therefore, as GaN is one of the best wide bandgap semiconductor candidates characterized by good stability, the weak oxidation of N may result in a better stability when it is hybridized with an organic-inorganic perovskite compared to a metal oxide. GaN have a wurtzite hexagonal crystal structure and a direct wide bandgap (~3.4 eV) at room temperature. Such wide bandgap can also enhance the response wavelength of a perovskite-based PD to the radiation in the UV region, as illustrated in FIGS. 10A and 10B. More specifically, FIG. 10A shows the absorption 1000 results in arbitrary units, versus the light wavelength, for a device that includes only a perovskite layer on glass while FIG. 10B shows the absorption 1010 for a device having CH$_3$NH$_3$Pbl$_3$ perovskite/GaN NWs grown on p-Si substrate and the absorption 1012 for a device having CH$_3$NH$_3$Pbl$_3$ perovskite/GaN NWs grown on a graphene substrate. It is noted that the pure CH$_3$NH$_3$Pbl$_3$ perovskite device is not sensitive in the UV range, i.e., wavelengths smaller than 400 nm, while the CH$_3$NH$_3$Pbl$_3$ perovskite/GaN NWs device becomes sensitive in the UV region, specifically in the 250 to 40 nm wavelength range. These hybrid devices also exhibit excellent thermal stability (2.1 W/cm K) and conductivity (2.1 W/cm K), rendering them suitable for applications in optoelectronic high-power and high-frequency devices.

To evaluate the response of these hybrid photodetectors, the I-V characteristics were measured under white light illumination from a 0.53 mW/cm$^2$ light source. In the case of the semiconductor device 800, the applied bias was 5.0 V, the dark current was 2.12 μA, and the photocurrent increased to 7.1 μA when the semiconductor device 800 was illuminated by the white light. In the case of the semiconductor device 900, the applied bias was 5.0 V, the dark current was 0.55 μA, and the photocurrent increased to 2.6 μA when the semiconductor device 900, employing a p-type silicon substrate, was illuminated by the white light. When the semiconductor device 900 employed a graphene substrate, the dark current was 0.12 μA and the photocurrent increased to 0.95 μA when the semiconductor device 900 was illuminated by the white light.

Photoresponsivity (R) and detectivity (D*) were also calculated for these devices, as these are two important parameters for estimating the performance of the photodetectors 800 and 900. Under illumination at 5 V, R=94 mA/W was obtained for the semiconductor device 800, whereas R=38.7 mA/W and R=15.8 mA/W was measured for the semiconductor device 900 when employing a graphene substrate. When compared with CH$_3$NH$_3$Pbl$_3$ perovskite/ GaN film results, these values are remarkable considering that this is the first photodetector based on GaN NWs/ CH$_3$NH$_3$Pbl$_3$ perovskite. Similarly, the detectivity values were D=1.57×10$^{13}$ Jones for the semiconductor device 800, 1.27×10$^{13}$ Jones for the semiconductor device 900 on a silicon substrate, and 1.14×10$^{13}$ Jones for the semiconductor device 900 on graphene substrate, which is comparable to the values reported for perovskite photodetectors. The deep UV photo-response at 200 nm improves due to the incorporation of gallium nitride nanowires. This finding is also in good agreement with the responsivity results of CH$_3$NH$_3$Pbl$_3$ perovskite/GaN film-based photodetector.

The photoresponse was obtained by switching the light source on/off many times to test the device behavior in the UV region under 5 V. To determine the changes in the photoresponse time during a single cycle, the rise and decay time of the photodetectors 800 and 900 were measured. For the semiconductor device 800 the rise time was 90 ms and the decay time was 260 ms. For the semiconductor device 900 having a silicon substrate, the rise time was 80 ms and the decay time was 200 ms. For the semiconductor device 900 having a graphene substrate, the rise time was 60 ms and the decay time was 200 ms. These values demonstrate a faster response characteristic compared to the previously reported data, which indicates that ITO-Ag electrodes and graphene substrate is the best for fast photodetectors. However, the ITO-Au configuration for the device fabricated on silicon exhibited the best R value. These results indicate that gallium nitride nanowires are particularly useful for a broadband photodetector.

Under illumination at 0.1V, a responsivity of 17.8 mA/W was measured for a GaN NWs/CsPbBr$_3$ perovskite photodetector and D=2.24×10$^{13}$ Jones. In addition, in contrast of the CH$_3$NH$_3$Pbl$_3$ perovskite/GaN device, this GaN NWs/ CsPbBr$_3$ perovskite photodetector could work as photovoltaic self-power device at 0V, due to good band alignment without barriers blocking the carrier flow between GaN (as electron carriers) and CsPbBr3 perovskite (hole carriers). An internal electric field created in the depletion layer between GaN (generated electron carriers) and CsPbBr$_3$ perovskite (generated hole carriers), is responsible for the electron hole separation even at 0V, creating photo-generated carriers and transient response faster than the carrier recombination time. Thus, a measured responsivity of 129 mA/VV and D of 1.52×10$^{14}$ Jones at 0V demonstrate that this device is promising as a photovoltaic device (solar cell).

To study the response of the photodetector, the I-V characteristics were measured under white light illumination provided by a 53 mW/cm$^2$ light source. For the p-Si/GaN NWs/CH3NH3Pbl3 perovskite device, at an applied bias between (−5 to 5) V, the dark current was 3.15 pA, and the photocurrent increased to 7.4 μA when the device was illuminated. For the p-Si/GaN NWs/CsPbBr3 perovskite device, at an applied biased of (−0.1 to 0.1) V, the current increased from 4.3 μA to 4.9 μA. In each case, the curves related to the dark current and photocurrent indicate good rectifying behavior. The inventors observed a maximum voltage at which the CsPbBr3 perovskite device works to be 0.1V.

It is known that gallium nitride is commercially used in ultraviolet light emitting diodes. However, the efficiency of ultraviolet light emitting diodes is still low (>3%) due to high-density dislocation defects that result from lattice mismatch between the substrate and the gallium nitride. Therefore, it is very advantageous to grow GaN nanorods for ultraviolet light emitting diodes with high efficiency, a schematic illustration of such a light emitting diode being illustrated in FIG. 11.

The semiconductor device 1100, which is an LED, includes a substrate 1105, a p-type doped semiconductor (e.g., GaN) layer 1110 formed on the substrate 1105, an interface layer and wetting layer 1107 (corresponding to layers 307 and 309 in FIG. 3) formed on the p-type doped semiconductor layer 1110 as the result of the growth of the semiconductor nanowires 1115, and n-type doped semiconductor nanowires 1115 formed on the doped semiconductor layer 1110. The bottom portion of the doped semiconductor nanowires is coated by a polymer layer 1120 and the upper portion of the doped semiconductor nanowires is coated by an indium tin oxide layer 1125. As illustrated, the doped semiconductor nanowires 1115 do not cover the entirety of the substrate 1105 and a first contact 1130 is formed directly on a side of the substrate 1105 in this area, next to the nanowires 1115. A second contact 1135 is formed on the indium tin oxide layer 1125. The second contact 1135 may include a first layer of Ti formed directly on the ITO layer 1125, and a second layer of gold formed on the first layer of Ti. The doping of the semiconductor layer 1110 and that of the semiconductor nanowires 1115 are different types of doping (i.e., one is a p-type doping and the other is an n-type doping) to provide the necessary p-n junction for the light emitting diode 1100.

In a non-limiting embodiment, the substrate 1105 is a sapphire substrate, the doped semiconductor layer 1110 is a p-doped gallium nitride film, the doped semiconductor nanowires 1115 are n-doped gallium nitride nanowires, the polymer layer 1120 is a polymethyl methacrylate (PMMA) layer, and the first and second contacts 1130 and 1135 comprise a layer of gold (Au) arranged on a layer of titanium (Ti). With respect to the first contact 1130, the layer of titanium is arranged directly on the substrate 1105 and with respect to the second contact 1135, the layer of titanium is arranged directly on the indium tin oxide layer 1125. Similarly to the other semiconductor devices discussed above, the III-nitride nanowires free of threading dislocations increase performance of the light emitting diode of FIG. 11 when compared to the conventional light emitting diodes.

In addition to using the semiconductor nanowires in the manner described above, these semiconductor nanowires can also be used as a growth template, for example to form multiple quantum wells (MQWs) based devices. Typically, gallium nitride multiple quantum wells are grown on a silicon substrate due to the low cost and wide availability of the silicon substrates. However, these devices are relatively inefficient due to the large lattice mismatch between the gallium nitride and silicon, which results in significant dislocation density. These dislocations, when penetrating the quantum wells (the active layer), reduce the device efficiency significantly. This can be addressed by growing semiconductor (e.g., III-nitride) nanowires on a substrate in the manner discussed above as a template for forming the multiple quantum wells. Forming semiconductor nanowires in the disclosed manner provides nanowires having very high emission with low defect band emission, which indicates a good crystal quality. Therefore, using the method discussed herein, III-nitride nanowires can be grown on, for example, a silicon substrate as template to grow III-nitride multiple quantum well ultraviolet and visible-based LED and laser diodes (LDs).

Figure 12A:
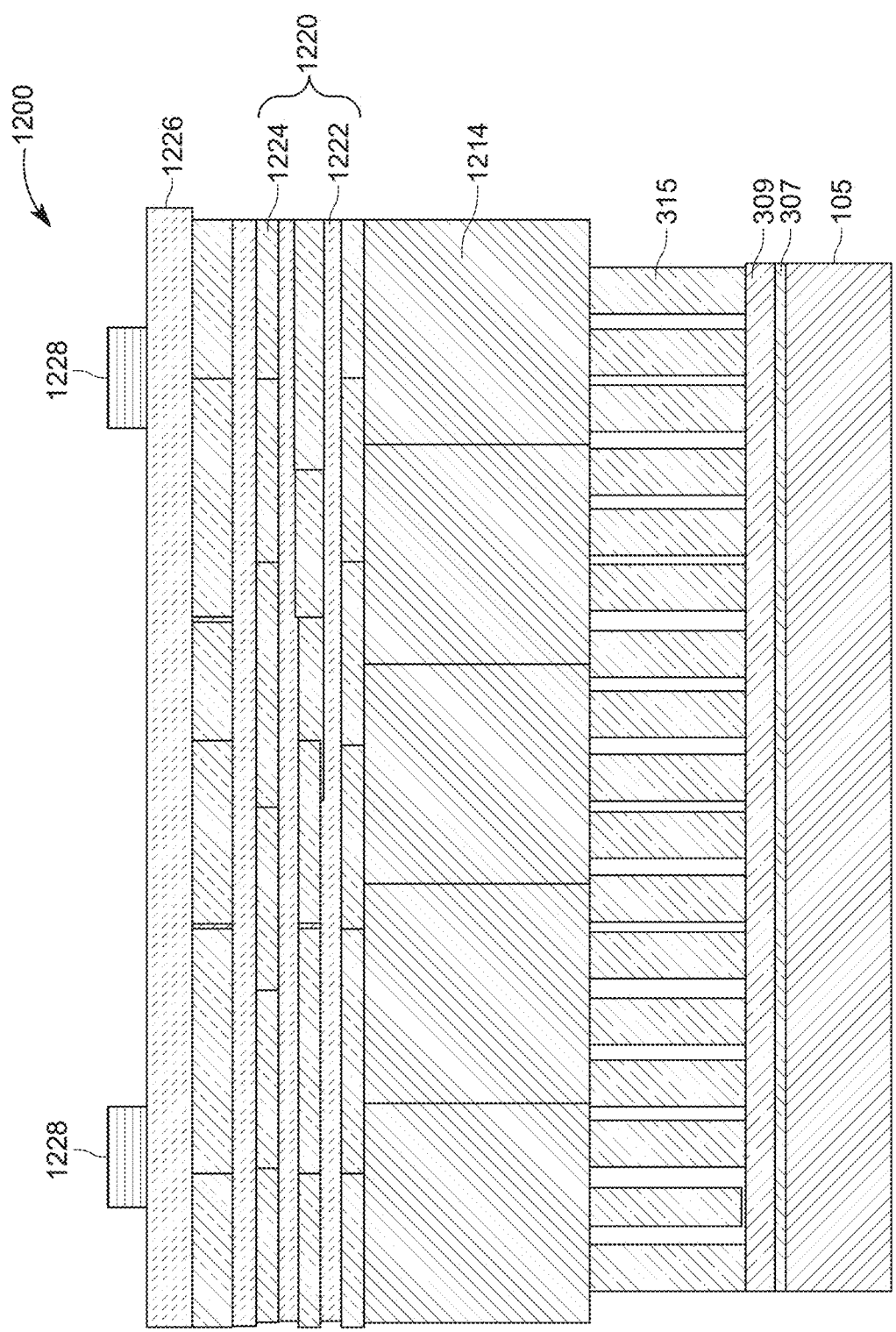
FIGS. 12A to 12C illustrate various semiconductor nanowire based laser devices (including vertical or lateral device)

More specifically, as illustrated in FIG. 12A, a laser device 1200 that includes plural III-nitride MQWs 1220 was formed on top of the semiconductor NW 315. The semiconductor nanowires 315 are formed as shown in FIGS. 3A to 3C, by the method illustrated in FIG. 2, on top of a wetting layer 309, that is separated by a nanolayer 307 from the substrate 105. The various materials that can be used for the substrate and the wetting layer and the semiconductor nanowires have been discussed above. In this embodiment, they wetting layer is a PLD made GaN layer and the nanowires are made by PLD to be GaN.

Directly on top of the GaN nanowires, a coalescent columnar GaN layer 1214 was formed at a given temperature. This layer may be doped to become an n-type layer. A coalescent columnar layer is a layer that starts as columns, that correspond to the nanowires, and gradually becomes a solid layer as the columns coalesce, as illustrated in the figure.

On top of the coalescent columnar GaN layer 1214, plural MQWs 1220 are formed by known methods. In one embodiment, the MQWs 1220 are made as InGaN layers 1222 and GaN layers 1224 that together form the quantum wells. Then, a contact layer 1226 is formed on top of the MQWs 1220 and a metallic pad 1228 is formed on the contact layer 1226. If the contact layer 1214 is a n-type layer, the contact layer 1226 is made to be a p-type layer as the laser device 1200 needs a p-n junction. Then, a first metallic pad 1228 is formed on top of the MQWs 1220 at one location and a second metallic pad (shown in the next figures) may be formed at various locations, depending of whether a lateral or vertical device is desired. Those skilled in the art would understand that the laser device 1200 is exemplary and its structure may be changed based on other known lasers. However, the novelty of such laser is the presence of the NWs 315 between the optical part (1214, 1220, 1226) of the laser and the substrate 105, which reduces the strain in the optical part, therefore increases the quality of the laser device. The laser device 1200 can in fact act as a UV or visible vertical-external-cavity surface-emitting-laser (VECSEL). The device 1200 may also be used as a light emitting device (LED).

High quality semiconductor materials formed on various substrates, based on the previously discussed methods allow different contact configurations, allowing the formation of vertical and lateral devices. Till now, there was no vertical LED or laser grown immediately on conductive substrates (such as vertical LED and visible VCSEL) laser due to low quality III-nitrides formed on the conductive substrates due to the dislocation effects. However, this problem is overcome with the method of FIG. 2 because no dislocation are present in the formed semiconductor materials. Further, the devices discussed herein may include semiconductor NW that are configured to emit light in different spectral range. For example, till now there is no high quality DUV LED or laser diode in the 280 to 200 nm range. However, with the present method, a semiconductor material that emits light in this range can be grown on various substrates to obtain such functionality. Other materials such as polymers can be hybridized with the NWs.

Figure 12B:
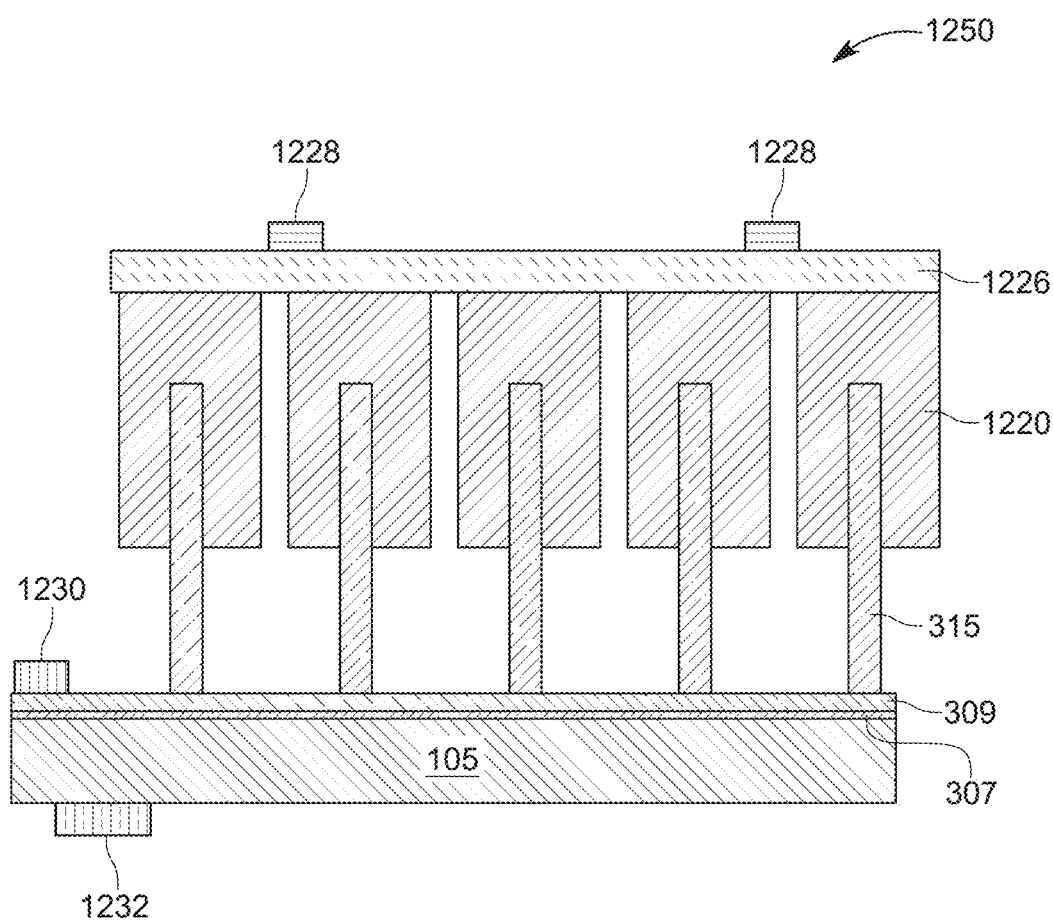
Figure 12C:
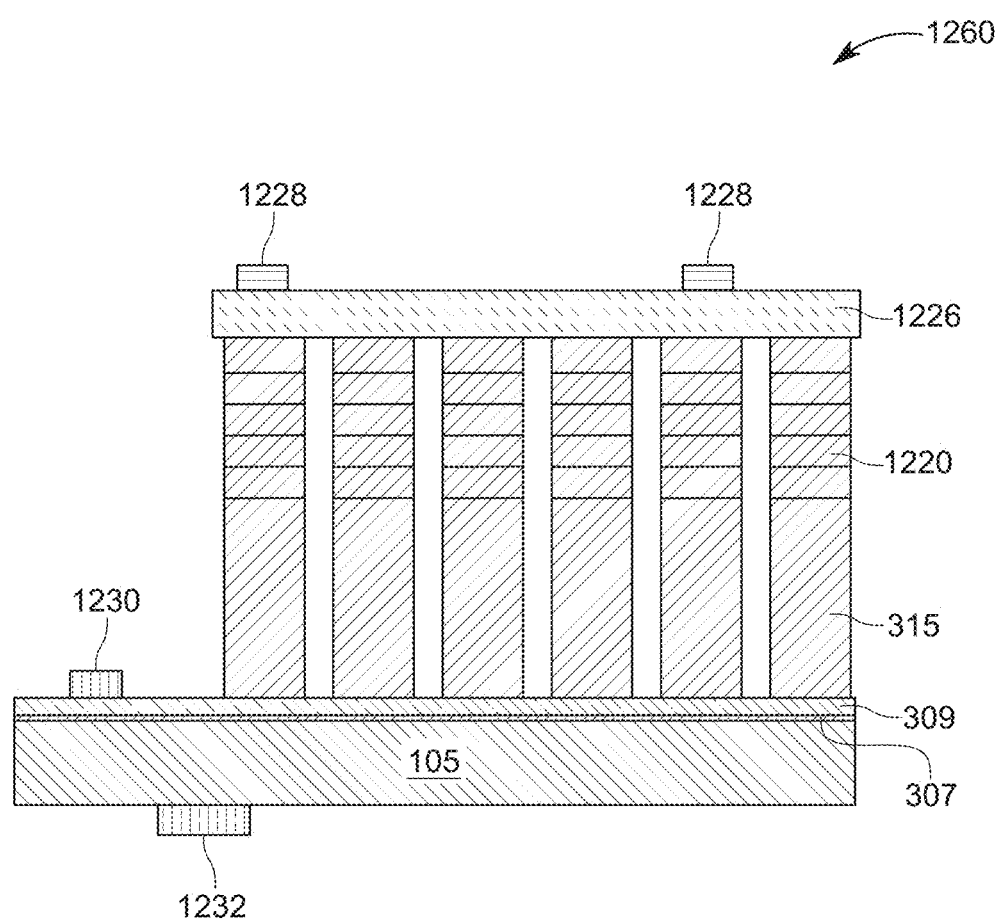
Figure 13:
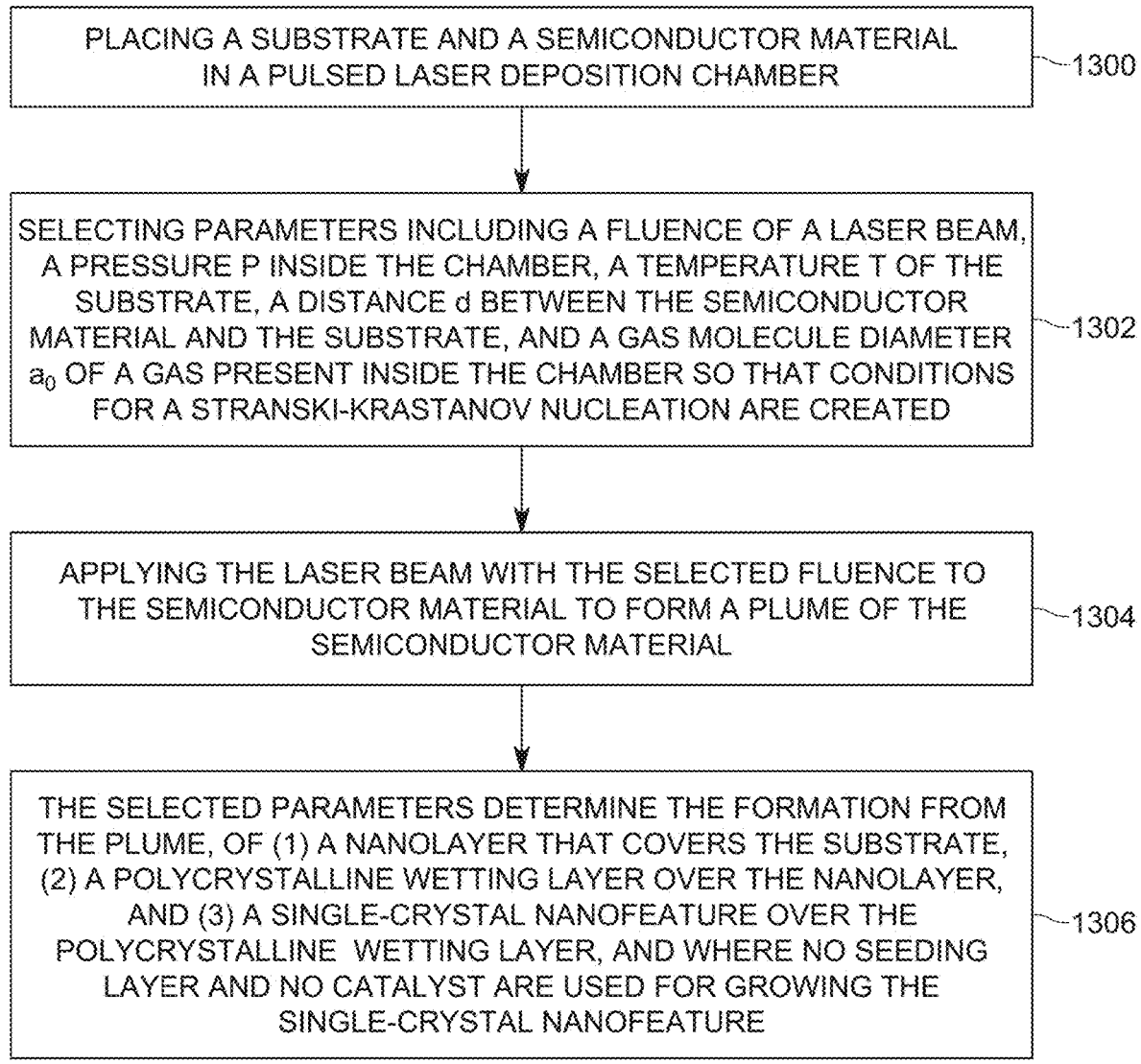
FIG. 13 is a flowchart of a method for making any of the above noted devices based on growing a semiconductor nanofeature with a pulsed laser deposition.

One possible QW-based device 1250 is illustrated in FIG. 12B. The device 1250, which can be an LED or laser diode, may have single- or multiple-QW 1220 formed around each nanofeature 315, and the contact layer 1226 is formed over all the QWs 1220. The first metallic contact 1228 is formed on the contact layer 1226, as in the embodiment of FIG. 12A, while the second metallic contact 1230 may be formed on the wetting layer 309, which acts as a contact p or n-type layer, for a lateral device, or the second metallic contact 1232 may be placed directly on the substrate 105, for a vertical device. Alternatively, as illustrated in FIG. 12C, the QW-based device 1260 has each nanofeature 315 grown to incorporate the single- or multiple-QWs 1220.

A method for forming a semiconductor nanostructure on a substrate, according to one or more of the embodiments discussed herein include a step 1300 of placing a substrate 105 and a semiconductor material 110 in a pulsed laser deposition chamber 115, a step 1302 of selecting parameters including a fluence of a laser beam 120, a pressure p inside the chamber 115, a temperature T of the substrate 105, a distance d between the semiconductor material 110 and the substrate 105, and a gas molecule diameter $a_0$ of a gas 113 present inside the chamber 115 so that conditions for a Stranski-Krastanov nucleation are created, and a step 1304 of applying the laser beam 120 with the selected fluence to the semiconductor material 110 to form a plume of the semiconductor material 110. The selected parameters determine in step 1306 the formation from the plume, of (1) a nanolayer 307 that covers the substrate 105, (2) a polycrystalline wetting layer 309 over the nanolayer 307, and (3) a single-crystal nanofeature 315 over the polycrystalline wetting layer 309, where no seeding layer and no catalyst are used for growing the single-crystal nanofeature 315.

In one application, there is a mismatch between a lattice constant of the substrate and a lattice constant of the single-crystal nanofeature, but no dislocation is present between the substrate and both wetting layer and the single-crystal nanofeature. The method may further include a step of maintaining constant the selected parameters during the growth of the semiconductor material on the substrate. In one application, an energy E of a species of the semiconductor material, with which the species lands on the substrate is determined by the selected fluence of the laser beam, the pressure p, the temperature T, the distance d, and the gas molecule diameter. The nanofeature is a nanowire or a nanorod. In one application, the semiconductor material is an III-nitride material and includes aluminum, gallium, indium, or boron. The semiconductor material may be GaN. The substrate may also be made of Si, or GaN, or sapphire, or MXene, or graphene, or $MoS_2$, or $WSe_2$. In one application, the nanolayer is formed from impurities present inside the chamber and has a thickness less than 2 nm.

The method may further include forming a hybrid photodetector by, forming a perovskite layer on at least some of the nanofeatures; forming a first electrical contact on the perovskite layer; and forming a second electrical contact on the substrate, where the nanofeatures are nanowires and the semiconductor material is a III-nitride material.

Alternatively, the method may further include forming a hybrid photodetector by, forming a perovskite layer on at least some of the nanofeatures; forming a first electrical contact on the perovskite layer; and forming a second electrical contact on the nanofeatures that are not covered by the perovskite layer, where the nanofeatures are nanowires and the semiconductor material is a III-nitride material.

In still another embodiment, the method may further include forming a light emitting diode by, forming a III-nitride film directly on the substrate, wherein the semiconductor wetting layer is arranged on the III-nitride film; forming a polymer layer covering a portion of the substrate and a lower portion of the nanofeatures; forming an indium tin oxide layer covering the polymer layer and an upper portion of the nanofeatures; forming a first electrical contact on the III-nitride film; and forming a second electrical contact on the polymer layer, where the nanofeatures are nanowires and the semiconductor material is a III-nitride material.

In yet another embodiment, the method may include forming a multiple quantum wells based laser device by, growing an n-type or p-type layer on top of the nanofeatures; growing the multiple quantum wells on the n-type or p-type layer; and growing a p-type or n-type layer on top of the multiple quantum wells, where the nanofeatures are nanowires and the semiconductor material is a III-nitride material.

As discussed above, the disclosed growth method is particularly advantageous because the vertical self-assembly III-nitride nanowires are formed without threading dislocations, which improves the performance of the resulting laser device. The absence of dislocations in the high-quality III-nitride nanowires, as well as nano-grains in the wetting layer (by acting as exciton localization centers), further enhanced the efficiency of the laser device. Carrier dynamics measurements on all devices discussed herein confirmed the superior ultraviolet efficiency, while a slight droop at high excitation densities is ascribed to a minor contribution from Auger recombination at high carrier injection rates.

The disclosed embodiments provide semiconductor nanostructures grown on a substrate by PLD, free of dislocations, with no seeding or catalyst, which enhance the UV sensitivity of such devices. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in specific combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for forming a semiconductor nanostructure on a substrate, the method comprising:
   placing a substrate and a semiconductor material in a pulsed laser deposition chamber, wherein the semiconductor material is a III-nitride material;
   selecting parameters including a fluence of a laser beam, a pressure P inside the chamber, a temperature T of the substrate, a distance d between the semiconductor material and the substrate, and a gas molecule diameter $a_0$ of a gas to be placed inside the chamber so that conditions for a Stranski-Krastanov nucleation are created; and
   applying the laser beam with the selected fluence to the semiconductor material to form a plume of the semiconductor material,
   wherein the selected parameters determine the formation, from the plume, of (1) a nanolayer, free of metal, that covers the substrate, (2) a polycrystalline wetting layer over the nanolayer, and (3) a single-crystal nanofeature over the polycrystalline wetting layer,
   wherein the single-crystal nanofeature is grown free of any catalyst and seeding layer, and wherein the single-crystal nanofeature is made of the III-nitride material.

2. The method of claim 1, wherein there is a mismatch between a lattice constant of the substrate and a lattice constant of the single-crystal nanofeature, but no dislocation is present between the substrate and the single-crystal nanofeature.

3. The method of claim 1, further comprising:
maintaining constant the selected parameters during a growing of the semiconductor material on the substrate.

4. The method of claim 1, wherein an energy E of a species of the semiconductor material, with which the species lands on the substrate, is determined by the selected fluence of the laser beam, the pressure P, the temperature T, the distance d, and the gas molecule diameter.

5. The method of claim 1, wherein the nanofeature is a nanowire or a nanorod.

6. The method of claim 1, wherein the III-nitride material comprises aluminum, gallium, indium, or boron.

7. The method of claim 1, wherein the substrate is made of Si, or GaN, or sapphire, or MXene, or graphene, or $MoS_2$, or $WSe_2$.

8. The method of claim 1, wherein the semiconductor material is GaN.

9. The method of claim 1, wherein the nanolayer is formed from impurities present inside the chamber and has a thickness less than 10 nm.

10. The method of claim 1, further comprising:
forming a hybrid photodetector or solar cell by,
forming a perovskite layer on at least some of the nanofeatures;
forming a first electrical contact on the perovskite layer; and
forming a second electrical contact on the substrate, wherein the nanofeatures are nanowires.

11. The method of claim 1, further comprising:
forming a hybrid photodetector or solar cell by,
forming a perovskite layer on at least some of the nanofeatures;
forming a first electrical contact on the perovskite layer; and
forming a second electrical contact on nanofeatures that are not covered by the perovskite layer,
wherein the nanofeatures are nanowires.

12. The method of claim 1, further comprising:
forming a light emitting diode by,
forming a III-nitride film directly on the substrate, wherein the semiconductor wetting layer is arranged on the III-nitride film;
forming a polymer layer covering a lower portion of the nanofeatures;
forming an indium tin oxide layer covering the polymer layer and an upper portion of the nanofeatures;
forming a first electrical contact on the III-nitride film; and
forming a second electrical contact on the polymer layer, wherein the nanofeatures are nanowires.

13. The method of claim 1, further comprising:
forming a single or multiple quantum wells based laser device by,
growing an n-type or p-type layer on top of the nanofeatures;
growing the multiple quantum wells on the n-type or p-type layer; and growing a p-type or n-type layer on top of the multiple quantum wells,
wherein the nanofeatures are nanowires.

14. A semiconductor device, comprising:
a substrate;
a nanolayer including oxygen (O), hydrogen (H), and carbon (C) atom impurities, and the nanolayer is located directly on the substrate, the nanolayer being free of metal;
a semiconductor, polycrystalline, wetting layer arranged on the nanolayer; and
semiconductor, single-crystal nanowires arranged directly on the semiconductor, polycrystalline, wetting layer,
wherein the semiconductor, single-crystal nanowires are free of threading dislocations, and
wherein a material of the semiconductor, polycrystalline, wetting layer and the semiconductor, single-crystal nanowires is a III-nitride material.

15. The semiconductor device of claim 14, wherein the nanolayer is made of atoms that are different from atoms of the semiconductor, polycrystalline, wetting layer or atoms of the semiconductor, single-crystal nanowires, and the semiconductor, polycrystalline, wetting layer and the semiconductor, single-crystal nanowires are made of the same atoms.

16. The semiconductor device of claim 14, further comprising:
a perovskite layer coating only part of the semiconductor, single-crystal nanowires;
a first electrical contact arranged on the perovskite layer; and
a second electrical contact arranged on the substrate or on semiconductor single-crystal nanowires that are not coated by the perovskite layer, to obtain a photodetector or a solar cell.

17. The semiconductor device of claim 14, further comprising:
a polymer layer covering a lower portion of the semiconductor, single-crystal nanowires;
an indium tin oxide layer covering the polymer layer and an upper portion of the semiconductor, single-crystal nanowires;
a first electrical contact arranged on the indium tin oxide layer; and
a second electrical contact arranged on the polymer layer wherein the semiconductor, polycrystalline, wetting layer is a p-type and the semiconductor, single-crystal nanowires are n-type to obtain a light emitting diode.

18. The semiconductor device of claim 14, further comprising:
a n-type layer formed directly on top of the semiconductor, single-crystal nanowires;
single or multiple quantum wells formed on the n-type layer; and
a p-type layer formed on the single or multiple quantum wells to obtain a laser device.

19. The semiconductor device of claim 18, wherein sides of a given semiconductor, single-crystal nanowire are coated with the single or multiple quantum wells.

20. The semiconductor device of claim 18, wherein a given semiconductor, single-crystal nanowire is grown to include the single or multiple quantum wells.

21. The semiconductor device of claim 14, wherein the material includes aluminum, gallium, indium, or boron, and the substrate is made of Si, or GaN, or sapphire, or MXene, or graphene, or $MOS_2$, or $WSe_2$.

* * * * *